United States Patent
Goda et al.

(10) Patent No.: US 11,835,380 B2
(45) Date of Patent: Dec. 5, 2023

(54) LIGHT-EMITTING DEVICE

(71) Applicant: NICHIA CORPORATION, Anan (JP)

(72) Inventors: Yuto Goda, Anan (JP); Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/057,217

(22) Filed: Nov. 20, 2022

(65) Prior Publication Data

US 2023/0160744 A1    May 25, 2023

(30) Foreign Application Priority Data

Nov. 25, 2021 (JP) .................................. 2021-191589

(51) Int. Cl.
| | |
|---|---|
| *G01J 1/04* | (2006.01) |
| *G01J 1/44* | (2006.01) |
| *G02B 27/01* | (2006.01) |

(52) U.S. Cl.
CPC ............. *G01J 1/0414* (2013.01); *G01J 1/44* (2013.01); *G02B 27/0172* (2013.01); *G02B 2027/0178* (2013.01)

(58) Field of Classification Search
CPC ... G02B 6/4286; G02B 6/4204; G02B 6/4214
See application file for complete search history.

(56) References Cited

U.S. PATENT DOCUMENTS

2003/0152338 A1*  8/2003  Kuhara ................ G02B 6/42
                                                      398/164
2021/0167576 A1   6/2021  Kimura et al.

FOREIGN PATENT DOCUMENTS

| JP | H01-81613 U    | 5/1989  |
|----|----------------|---------|
| JP | H02-278779 A   | 11/1990 |
| JP | 2003-037328 A  | 2/2003  |
| JP | 2003-114312 A  | 4/2003  |
| JP | 2005-158822 A  | 6/2005  |
| JP | 2011-049338 A  | 3/2011  |
| JP | 2017-208568 A  | 11/2017 |
| JP | 2020-021877 A  | 2/2020  |
| JP | 2021-093514 A  | 6/2021  |

\* cited by examiner

*Primary Examiner* — Thanh Luu
(74) *Attorney, Agent, or Firm* — Global IP Counselors, LLP

(57) ABSTRACT

A light-emitting device includes a plurality of light-emitting elements, a photodetector, an optical member and a bonding portion. The light-emitting elements include a first light-emitting element configured to emit first light and a second light-emitting element configured to emit second light. The photodetector is configured to receive a part of light emitted from each of the light-emitting elements. The photodetector has a first bonding surface. The optical member has a second bonding surface and a first inner side surface. The first inner side surface is continuous from the second bonding surface. The light emitted from each of the plurality of light-emitting elements is configured to pass through the optical member. The bonding portion bonds the photodetector and the optical member with the bonding portion being in contact with the first bonding surface, the second bonding surface, and at least a part of the first inner side surface.

14 Claims, 15 Drawing Sheets

LIGHT-EMITTING DEVICE

CROSS-REFERENCE TO RELATED APPLICATION

This application claims priority to Japanese Patent Application No. 2021-191589, filed on Nov. 25, 2021, the disclosure of which is hereby incorporated herein by reference in its entirety.

BACKGROUND

The present disclosure relates to a light-emitting device.

Japanese Patent Publication No. 2021-93514 discloses a light source device including a light-emitting element, an optical member that reflects a part of light emitted from the light-emitting element and transmits the remaining light, and a photodetector that receives the light transmitted through the optical member. Furthermore, the light source device disclosed in the Japanese Patent Publication No. 2021-93514 has an object to monitor an output of laser light with high accuracy and provides a slit as one solution related to the object.

SUMMARY

In a manufacturing process of a light-emitting device, the occurrence of trouble such as poor bonding is preferably suppressed. There is room for considering the improvement in order to provide a light-emitting device having stable quality.

In an exemplary and non-limiting embodiment, a light-emitting device according to the present disclosure includes a plurality of light-emitting elements, a photodetector, an optical member and a bonding portion. The plurality of light-emitting elements include a first light-emitting element configured to emit first light and a second light-emitting element configured to emit second light. The photodetector is configured to receive a part of light emitted from each of the plurality of light-emitting elements. The photodetector has a first bonding surface. The optical member has a second bonding surface and a first inner side surface. The second bonding surface is bonded to the first bonding surface of the photodetector. The first inner side surface is continuous from the second bonding surface. The light emitted from each of the plurality of light-emitting elements is configured to pass through the optical member. The bonding portion bonds the photodetector and the optical member with the bonding portion being in contact with the first bonding surface, the second bonding surface, and at least a part of the first inner side surface.

Embodiments of the present disclosure can provide a light-emitting device having stable quality.

DETAILED DESCRIPTION

Figure 1:
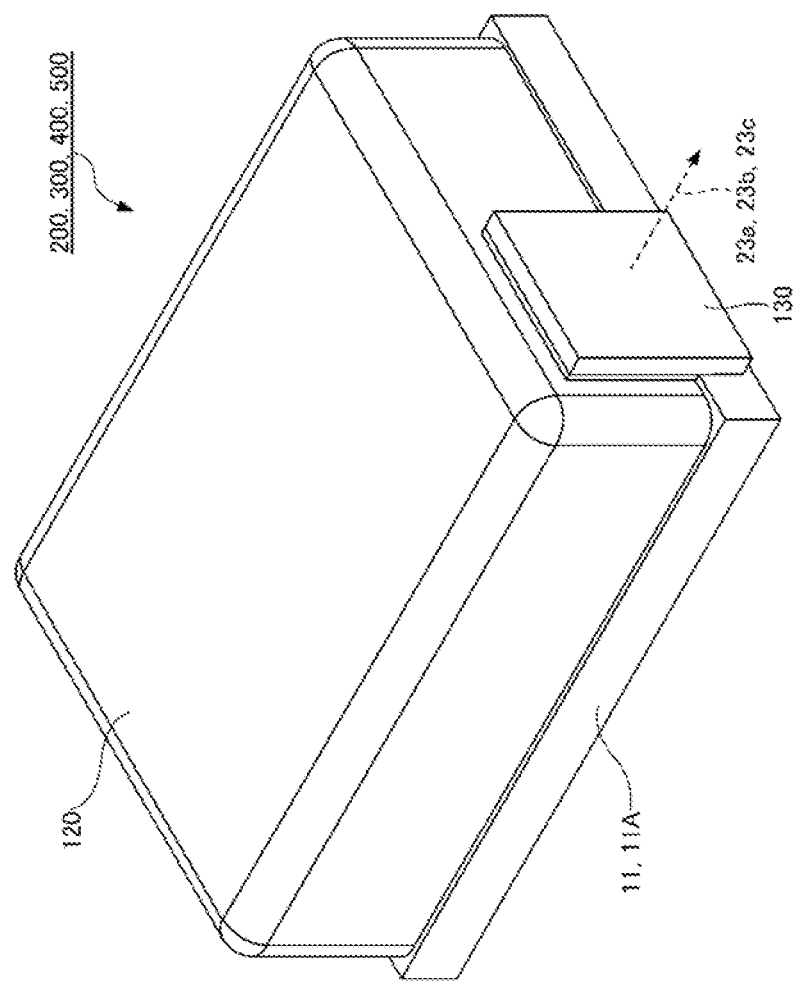
FIG. 1 is a perspective view of a light-emitting device according to a first embodiment of the present disclosure.

In the present description or the scope of the claims, a polygon such as a triangle and a quadrangle is not limited to a polygon in a mathematically strict sense and also includes a shape in which a corner of the polygon is processed to be rounded, chamfered, beveled, coved, and the like. Furthermore, a shape obtained by processing not only the corner (an end of a side) of the polygon, but also a middle portion of the side is similarly referred to as a polygon. In other words, a shape partially processed while leaving the polygon as a base is included in the "polygon" described in the present description and the scope of the claims.

The same applies not only to the polygon but also to a word representing a specific shape such as a trapezoid, a circle, a protrusion, and a recession. The same applies when dealing with each side forming that shape. In other words, even when a corner and a middle portion of a certain side are processed, the "side" also includes the processed portion. When the "polygon" or "side" not partially processed is to be distinguished from a processed shape, "strict" will be added to the description as in, for example, a "strict quadrangle".

In the present description or the scope of the claims, when there are a plurality of components identified by a certain term and each of the components is to be expressed separately, an ordinal number such as "first" and "second" may be added in front of each of the terms of the components. For example, when it is described that "light-emitting elements are disposed on a substrate" in the claims, it may be described that "a first light-emitting element and a second light-emitting element are arrayed on a substrate" in the description. The ordinal numbers of "first" and "second" are used to distinguish the two light-emitting elements. A term of a component provided with the same ordinal number may not refer to the same component between the description and the claims. For example, when components identified by terms of a "first light-emitting element", a "second light-emitting element", and a "third light-emitting element" are described in the description, a "first light-emitting element"

and a "second light-emitting element" in the claims may correspond to the "first light-emitting element" and the "third light-emitting element" in the description. Furthermore, in claim 1 described in the claims, when the term of the "first light-emitting element" is used and the term of the "second light-emitting element" is not used, the invention according to claim 1 includes one light-emitting element. The light-emitting element is not limited to the "first light-emitting element" in the description, and can be the "second light-emitting element" or the "third light-emitting element".

In the present description or the scope of the claims, terms indicating a specific direction or position (for example, "upper", "lower", "right", "left", "front", and "rear") may be used. The terms are merely used to make it easy to understand a relative direction or position in the referenced drawing. As long as the relative direction or position is the same as that described in the referenced drawing using the term such as "upper" or "lower", in drawings other than the drawings of the present disclosure, actual products, manufacturing devices, and the like, components need not necessarily be arranged in the same manner as in the referenced drawing.

A size, a size ratio, a shape, an arrangement interval, and the like of a component or a member illustrated in the drawings may be exaggerated for ease of understanding. Furthermore, in order to avoid excessive complication of the drawings, illustration of some elements may be omitted.

Embodiments of the present invention will be described below with reference to the drawings. The embodiments are for embodying the technical concept of the present invention but are not intended to limit the present invention. A numerical value, a shape, a material, and the like indicated in the description of the embodiments are merely one example, and various modifications can be made as long as a technical contradiction does not arise. In the following description, a component identified by the same term and reference sign is the same component or a similar component, and duplicate descriptions of the components may be omitted.

First Embodiment

A schematic structure of a light-emitting device according to a first embodiment will be described with reference to the drawings. FIGS. 1 to 7B are drawings for illustrating an exemplary embodiment of a light-emitting device 200. In the accompanying drawings, an X-axis, a Y-axis, and a Z-axis orthogonal to each other are indicated for reference.

Figure 2:
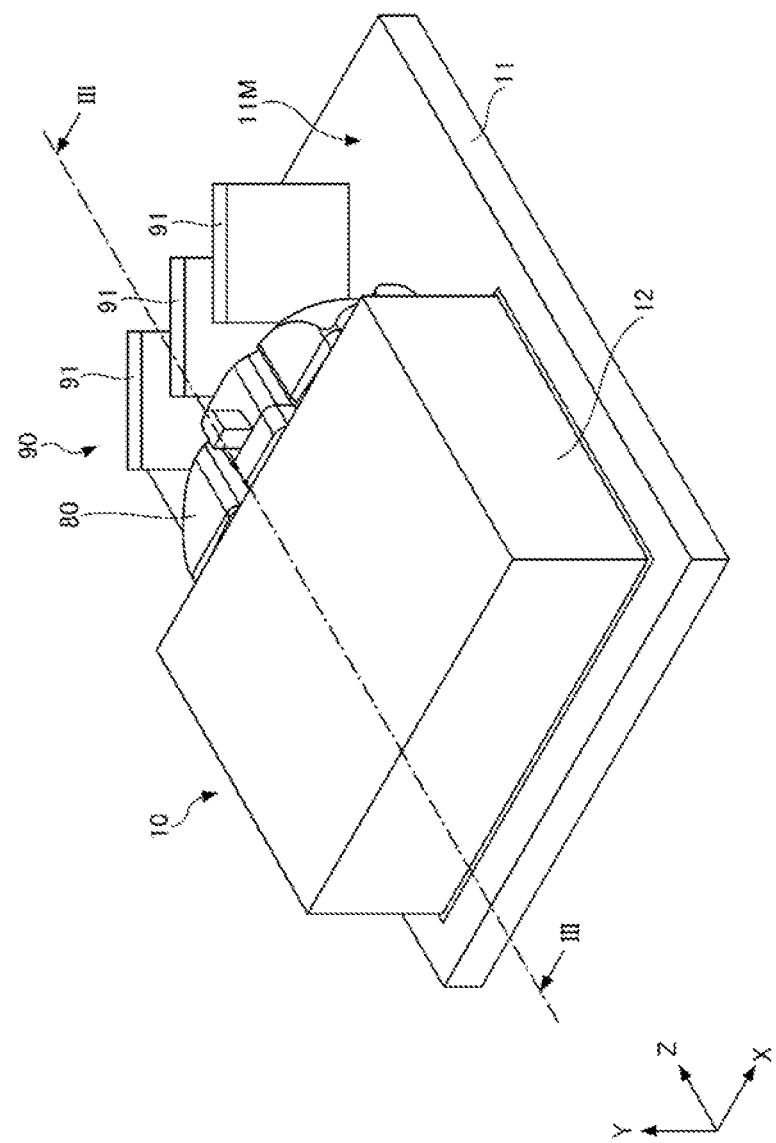
FIG. 2 is a perspective view of the light-emitting device according to the first embodiment of the present disclosure excluding a second cap and a lid member.
Figure 3:
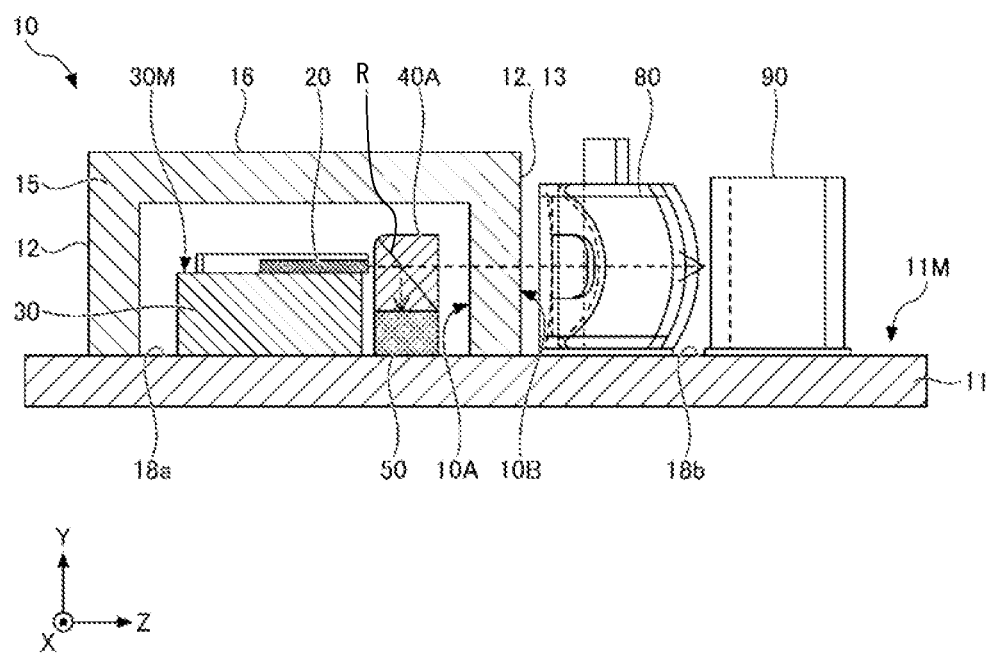
FIG. 3 is a cross-sectional view taken along a section line in FIG. 2.
Figure 4:
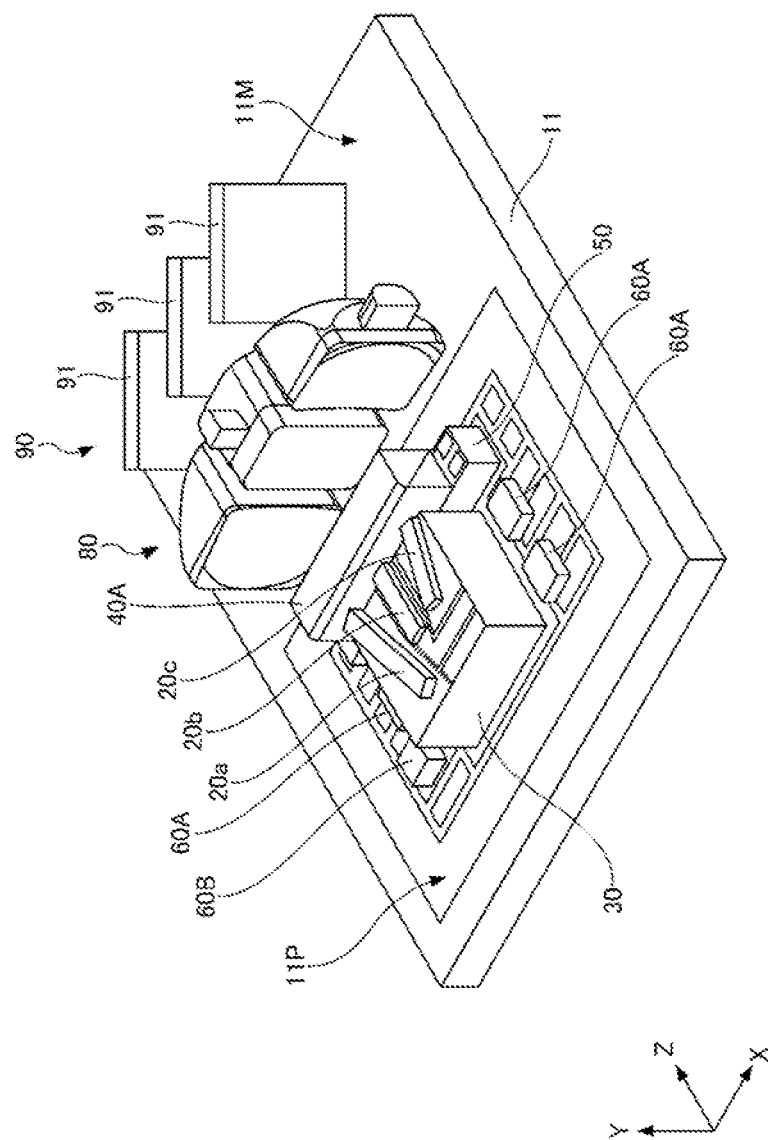
FIG. 4 is a perspective view of the light-emitting device according to the first embodiment of the present disclosure excluding a first cap, the second cap, and the lid member.
Figure 5:
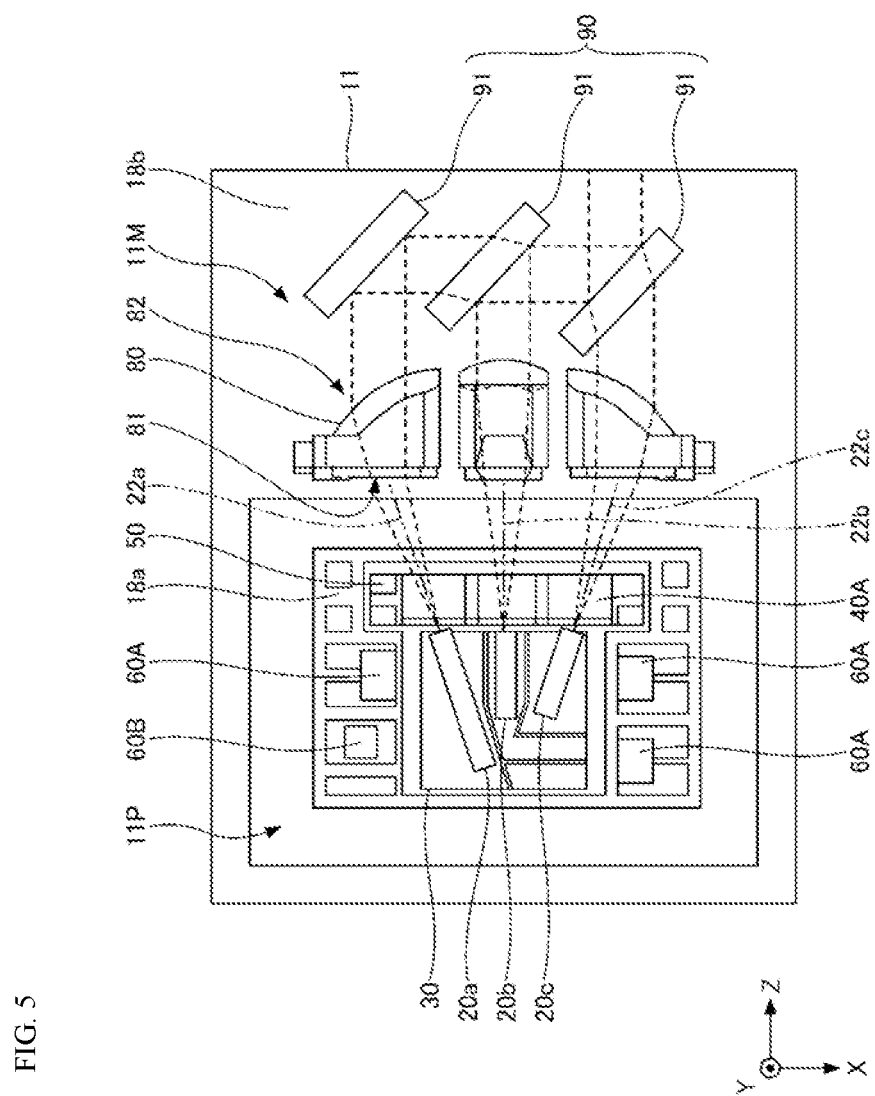
FIG. 5 is a top view corresponding to the perspective view illustrated in FIG. 4.
Figure 6:
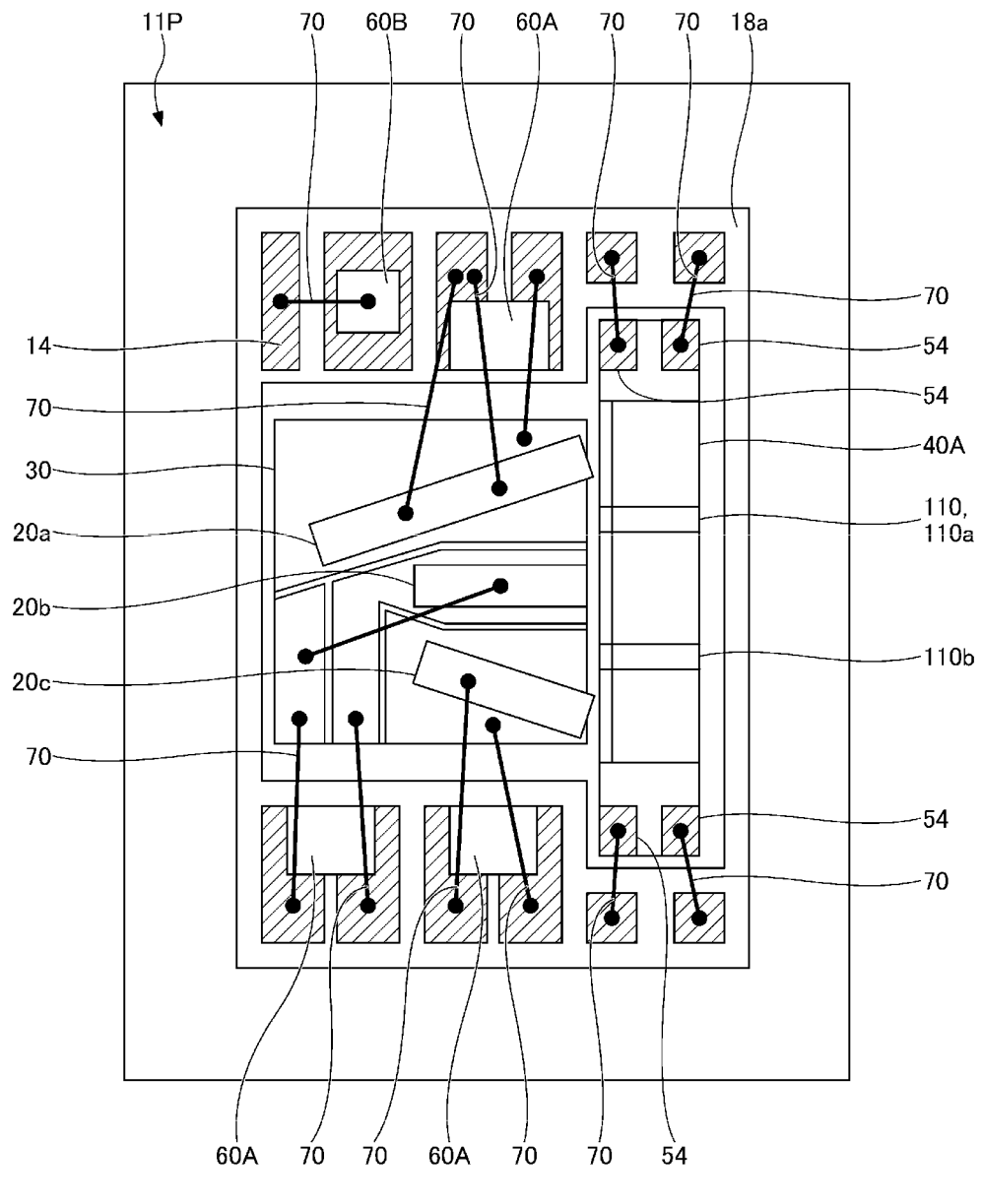
FIG. 6 is a top view illustrating wiring lines inside a package.
Figure 7A:
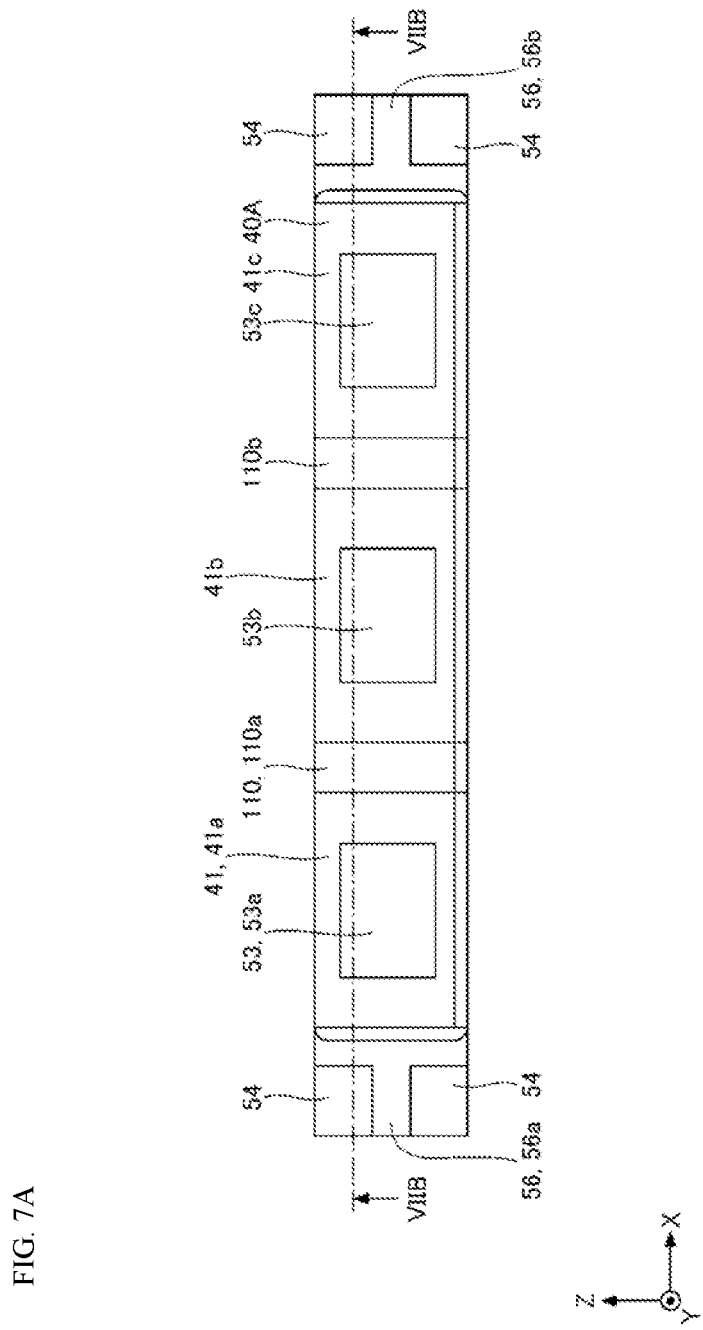
FIG. 7A is a top view of an optical member and a photodetector according to the first embodiment.
Figure 7B:
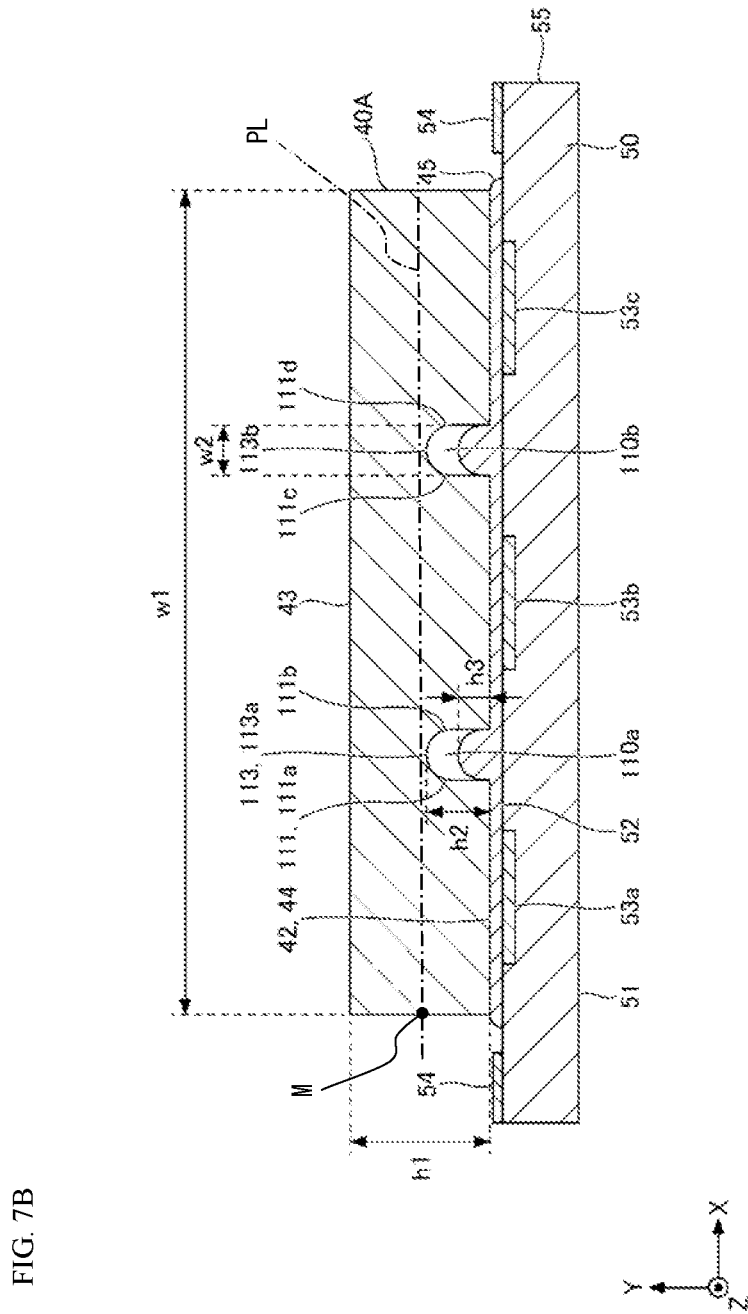
FIG. 7B is a cross-sectional view of the optical member and the photodetector taken along a section line VIIB-VIIB in FIG. 7A.

FIG. 1 is a perspective view of the light-emitting device 200. FIG. 2 is a perspective view of the light-emitting device 200 excluding a second cap 120 and a lid member 130. FIG. 3 is a cross-sectional view taken along a section line in FIG. 2. In FIG. 3, light traveling on an optical axis among light emitted from a light-emitting element 20 is indicated by a dotted line. FIG. 4 is a perspective view of the light-emitting device 200 excluding a first cap 16 and the second cap 120. FIG. 5 is a top view corresponding to the perspective view illustrated in FIG. 4. In FIG. 5, light traveling on the optical axis among light emitted from each of three light-emitting elements 20 is indicated by a dot-dash line. FIG. 6 is a top view illustrating wiring lines inside a package 10. FIG. 7A is a top view of an optical member and a photodetector according to the first embodiment. FIG. 7B is a cross-sectional view of the optical member and the photodetector taken along a section line VIIB-VIIB in FIG. 7A.

The light-emitting device 200 according to the present embodiment includes a substrate 11, the first cap 16 (see FIG. 3), and the plurality of light-emitting elements 20. The light-emitting device 200 in the illustrated by drawings further includes a submount 30, an optical member 40A, a photodetector 50, one or a plurality of protective elements 60A, a temperature measuring element 60B, one or a plurality of lens members 80, a beam combiner 90, the second cap 120, and the lid member 130. However, these components are not essential. The plurality of light-emitting elements 20 are configured to include a first light-emitting element 20a and a second light-emitting element 20b. Furthermore, the plurality of light-emitting elements 20 can be configured to further include a third light-emitting element 20c. The plurality of light-emitting elements 20 may include two or more light-emitting elements 20 having an equal emission peak wavelength.

In the light-emitting device 200 in the illustrated by the drawings, the plurality of light-emitting elements 20, the submount 30, the optical member 40A, the photodetector 50, the plurality of protective elements 60A, and the temperature measuring element 60B are disposed in a space defined by the substrate 11 and the first cap 16. Further, the lens member 80 and the beam combiner 90 are disposed outside the space.

The light-emitting device 200 in the present embodiment has a substantially box shape. A size in an X direction can be, for example, equal to or less than 10 mm, and a size in a Z direction can be, for example, equal to or less than 15 mm. A height in a Y direction can be, for example, equal to or less than 4 mm.

First, each of the components will be described.

Substrate 11

The substrate 11 includes an upper surface and a lower surface facing the upper surface. The upper surface functions as a mounting surface 11M on which one or more components included in the light-emitting device 200 are disposed. The mounting surface 11M is a flat plane. The mounting surface 11M includes a first mounting region 18a and a second mounting region 18b. The first mounting region 18a and the second mounting region 18b are provided on the same flat plane. Note that the first mounting region 18a and the second mounting region 18b may not be provided on the same flat plane. For example, the substrate 11 may include flat planes having different heights, and the first mounting region 18a and the second mounting region 18b may be provided on the corresponding flat planes.

The substrate 11 can be formed of ceramic as a main material. Examples of the ceramic include aluminum nitride, silicon nitride, aluminum oxide, silicon carbide, and the like. The substrate 11 in the illustrated by the drawings has a flat plate shape. Note that the substrate 11 may not have the flat plate shape.

First Cap 16

The first cap 16 includes a side wall portion 12 and an upper portion 15. The first cap 16 has a recessed shape. An outer shape of the first cap 16 is rectangular in a top view. However, the outer shape of the first cap 16 does not need to be rectangular, and may be, for example, polygonal other than quadrangular, circular, or the like. An internal space surrounded by the substrate 11, the side wall portion 12, and the upper portion 15 can be a sealed space. Furthermore, the internal space can be in an airtight state.

The side wall portion 12 surrounds the first mounting region 18a of the substrate 11 and extends above the mounting surface 11M. One or more components disposed in the first mounting region 18a are surrounded by the side wall portion 12. The side wall portion 12 does not surround the second mounting region 18b of the substrate 11. One or more components disposed in the second mounting region 18b are not surrounded by the side wall portion 12. The upper portion 15 is connected to the side wall portion 12 at a position above the mounting surface 11M. The upper portion 15 is located directly above one or more components disposed in the first mounting region 18a.

For example, the first cap 16 can be manufactured from a light-transmissive material such as glass, plastic, quartz, and sapphire by using a processing technique such as molding or etching. The first cap 16 may be formed by bonding the upper portion 15 and the side wall portion 12 that are individually formed by using different materials as main materials. For example, the main material of the upper portion 15 can be a non-light transmissive material such as monocrystalline silicon or polycrystalline silicone, and the main material of the side wall portion 12 can be a light-transmissive material such as glass.

In the illustrated by the drawings, the first cap 16 and the substrate 11 are collectively referred to as the package 10. In the top view as seen along a normal direction of the mounting surface 11M of the substrate 11, that is, the illustrated Y direction, an outer shape of the package 10 is rectangular. The outer shape of the package 10 does not need to be rectangular, and may be, for example, polygonal other than quadrangular, circular, or the like. However, the "package" in the present embodiment is not limited thereto. In the present embodiment, the "package" can be a general structure including a "base portion" on which one or a plurality of members are disposed, and a "side wall portion" surrounding the one or the plurality of members. The "substrate 11" and the "side wall portion 12" in the illustrated by the drawings are one example of the "base portion" and the "side wall portion" of the package 10, respectively.

Next, the package 10 in the illustrated by the drawings will be described. As illustrated in FIG. 6, the package 10 includes a plurality of wiring regions 14 for achieving electrical connection. The plurality of wiring regions 14 are provided in the first mounting region 18a. Note that, in FIG. 6, instead of providing a reference sign to all of the plurality of wiring regions 14, the same hatching is applied to each of the wiring regions 14. The plurality of wiring regions 14 can be electrically connected to a wiring region provided on the lower surface of the substrate 11 (a surface opposite to the mounting surface 11M) through a via hole passing through an inside of the substrate 11. The wiring region electrically connected to the wiring region 14 is not limited to being provided on the lower surface of the substrate 11 and may be provided on another external surface (upper surface or outer side surface) of the package 10.

As illustrated in FIG. 3, the package 10 includes a light incident surface 10A and a light extraction surface 10B that have light transmissivity on the side wall portion 12. At least one surface of one or a plurality of outer side surfaces constituting the side wall portion 12 can be the light extraction surface 10B. The light extraction surface 10B can be perpendicular to the mounting surface 11M. Note that the term "perpendicular" used here allows an error within ±5 degrees. The light extraction surface 10B may be inclined to the mounting surface 11M.

At least a part of a region of the light extraction surface 10B has light transmissivity. The region having the light transmissivity is referred to as a light-transmissive region 13 (see FIG. 3). Here, "having light transmissivity" means that a property in which a transmittance of main light incident thereon is equal to or more than 80% is satisfied. The light-transmissive region 13 may be located across the plurality of outer side surfaces of the package 10. Further, the region having light transmissivity in the package 10 may not be limited to the light-transmissive region 13. In the example of the illustrated package 10 illustrated by the drawings, the package 10 includes four outer side surfaces corresponding to the rectangular outer shape. All of the four outer side surfaces have light transmissivity. One surface of the four outer side surfaces is the light extraction surface 10B.

The mounting surface 11M of the substrate 11 further includes a peripheral region 11P. The peripheral region 11P surrounds the first mounting region 18a. The peripheral region 11P surrounds the first mounting region 18a and does not surround the second mounting region 18b. The plurality of wiring regions 14 are surrounded by the peripheral region 11P. The first cap 16 is bonded to the peripheral region 11P of the substrate 11. A metal film for bonding can be formed on the peripheral region 11P. The plurality of wiring regions 14 can include a metal film that is formed of a conductor such as metal and is patterned.

Second Cap 120

In the example of the light-emitting device 200 illustrated by the drawings, the second cap 120 has a recessed shape. An outer shape of the second cap 120 is rectangular in the top view. In the top view as seen along the normal direction of the mounting surface 11M of the substrate 11, the second cap 120 includes the first cap 16. The second cap 120 is fixed to the substrate 11. The second cap 120 is bonded to a peripheral region along an outer edge of the mounting surface 11M. An internal space of the second cap 120 is formed by bonding the second cap 120 to the substrate 11. The internal space can be a sealed space. All of the one or the plurality of components disposed on the mounting surface 11M of the substrate 11 can be accommodated in the internal space.

In the example of the second cap 120 illustrated by the drawings, an opening is provided in a side view as seen along the Z direction side. The second cap 120 can be formed of a light blocking material that blocks light. For example, the second cap 120 can be manufactured by molding a shape of the second cap 120 from glass and providing a light blocking film on a surface of the second cap 120.

Lid Member 130

The lid member 130 has light transmissivity. The lid member 130 illustrated in FIG. 1 has a flat plate shape. The lid member 130 is bonded to the substrate 11 and the second cap 120. The lid member 130 covers the opening provided in the second cap 120. The internal space formed of the second cap 120 can be a closed space by closing the opening of the second cap 120 with the lid member 130.

Light-Emitting Element 20

Examples of the light-emitting element 20 include a semiconductor laser element (or a laser diode). The light-emitting element 20 can have an outer shape of the rectangle in the top view. When the light-emitting element 20 is an edge-emitting semiconductor laser element, a side surface intersecting one side of two short sides of the rectangle is an emission end surface. An upper surface and a lower surface of the light-emitting element 20 have an area greater than that of the emission end surface. The light-emitting element 20 is not limited to an edge-emitting semiconductor laser element and may be a surface-emitting semiconductor laser element such as a vertical cavity surface emitting laser (VCSEL), a light-emitting diode (LED), or the like.

The light-emitting element 20 in the present embodiment includes one or more light-emitting points on the emission end surface. The light-emitting element 20 may be a single emitter including one light-emitting point on the emission end surface or may be a multi-emitter including two or more light-emitting points on the emission end surface. The example of the light-emitting element 20 illustrated by the drawings is the single emitter.

Here, a description of a case in which the light-emitting element 20 is an edge-emitting semiconductor laser element is supplemented. Light (laser light) emitted from the emission end surface of the semiconductor laser element is divergent light that spreads. The laser light forms a far field pattern (hereinafter referred to as an "FFP") of an elliptical shape on a plane parallel to the emission end surface. The FFP indicates a shape and a light intensity distribution of the emitted light at a position spaced apart from the emission end surface.

Light passing through the center of the elliptical shape of the FFP, in other words, light having a peak intensity in the light intensity distribution of the FFP, is referred to as light traveling on an optical axis. An optical path of the light traveling on the optical axis is referred to as the optical axis of the light. In the present embodiment, based on the light intensity distribution of the FFP, light having an intensity of $1/e^2$ or more with respect to a peak intensity value is referred to as the light of a "main portion". Note that, based on the light intensity distribution of the FFP, light having an intensity of half or more of the peak intensity value may be referred to as the light of the "main portion". Note that, in FIG. 5, the light of the main portion emitted from the emission end surface of each of the light-emitting elements 20a, 20b, and 20c is indicated by a dashed line.

In the elliptical shape of the FFP of the light emitted from the light-emitting element 20 being a semiconductor laser element, a minor axis direction of the elliptical shape is referred to as a slow axis direction, and a major axis direction is referred to as a fast axis direction. A plurality of layers including an active layer constituting the semiconductor laser element can be layered in the fast axis direction.

Based on the light intensity distribution of the FFP, an angle corresponding to $1/e^2$ of the light intensity distribution is a spread angle of light of the semiconductor laser element. The spread angle of light in the fast axis direction is referred to as a fast-axis spread angle, and the spread angle of light in the slow axis direction is referred to as a slow-axis spread angle. The spread angle in the slow axis direction emitted from the semiconductor laser element can be equal to or more than 3°.

As the light-emitting element 20, for example, a semiconductor laser element that emits red light, a semiconductor laser element that emits green light, a semiconductor laser element that emits blue light, or the like can be employed. Note that the light-emitting element 20 may emit light other than red light, green light, and blue light. Further, the light-emitting element 20 may emit light other than visible light.

Blue light refers to light having an emission peak wavelength within a range from 420 nm to 494 nm. Green light refers to light having the emission peak wavelength within a range from 495 nm to 570 nm. Red light refers to light having the emission peak wavelength within a range from 605 nm to 750 nm.

Examples of the semiconductor laser element that emits blue light or the semiconductor laser element that emits green light include a semiconductor laser element including a nitride semiconductor. GaN, InGaN, and AlGaN, for example, can be used as the nitride semiconductor. Examples of the semiconductor laser element that emits red light include a semiconductor laser element including an InAlGaP-based, GaInP-based, GaAs-based, or AlGaAs-based semiconductor.

Submount 30

As illustrated in FIG. 3, the submount 30 can include an upper surface 30M and a lower surface located opposite to the upper surface 30M and can have a rectangular parallelepiped shape. The upper surface 30M and the lower surface each function as a bonding surface. A distance between the upper surface 30M and the lower surface is shorter than distances between other two facing surfaces. A shape of the submount 30 may not limited to a rectangular parallelepiped. The submount 30 can be formed of, for example, silicon nitride, aluminum nitride, or silicon carbide. The submount 30 may include a metal film for bonding. The metal film for bonding is provided on each of the upper surface 30M and the lower surface. One or a plurality of wiring regions electrically connected to other components can be provided on the upper surface 30M.

Optical Member 40A

The optical member 40A includes a light incident surface and a light emission surface. The light emission surface is a surface opposite to the light incident surface. Further, the optical member 40A includes a partial reflective surface (for example, the partial reflective surface R in FIG. 3). The partial reflective surface reflects a part of light incident to the light incident surface and transmits the remaining light.

The partial reflective surface serves as a beam splitter. The light incident on the partial reflective surface is divided into two lights traveling in different directions. The two divided lights include light having the same wavelength. The optical member 40A divides the same wavelength component of the incident light into two at a predetermined ratio. For example, one of the two lights divided by the optical member 40A can be used as primary light (hereinafter referred to as "main light"), and the other of the two lights can be used as light (hereinafter referred to as "monitor light") for monitoring to control the main light.

The optical member 40A can be a rectangular parallelepiped as illustrated in FIGS. 3 and 4. The optical member 40A includes an upper surface 43, a lower surface 44, and a plurality of outer side surfaces. Further, as illustrated in FIG. 7B, the optical member 40A includes one or a plurality of recessed portions 110. The optical member 40A can include the plurality of recessed portions 110 including a first recessed portion 110a and a second recessed portion 110b.

The recessed portion 110 includes one or a plurality of inner side surfaces 111. The inner side surface 111 is continuous from the lower surface 44. In other words, the lower surface 44 and the inner side surface 111 intersect each other. The recessed portion 110 can include the plurality of inner side surfaces 111 including an inner side surface 111*a* and an inner side surface 111*b* facing each other.

The recessed portion 110 further includes a lower surface 113 intersecting the inner side surface 111. The lower surface 113 is continuous from the inner side surface 111. The lower surface 113 intersects an upper side of the inner side surface 111. The lower surface 113 can also be referred to as a connection surface that connects to the inner side surface 111*a* and the inner side surface 111*b* facing each other. In the recessed portion 110, a recessed shape is defined by the inner side surface 111*a*, the inner side surface 111*b*, and the lower surface 113.

Here, regarding the inner side surface and the lower surface included in the recessed portion 110, for a distinction, an inner side surface and a lower surface included in the first recessed portion 110*a* are referred to as a first inner side surface and a first lower surface, respectively, and an inner side surface and a lower surface included in the second recessed portion 110*b* are referred to as a second inner side surface and a second lower surface, respectively. In FIGS. 7A and 7B, two inner side surfaces 111 and the lower surface 113 included in the first recessed portion 110*a* are indicated by the first inner side surface 111*a*, the first inner side surface 111*b*, and a first lower surface 113*a*, and two inner side surfaces 111 and the lower surface 113 included in the second recessed portion 110*b* are indicated by a second inner side surface 111*c*, a second inner side surface 111*d*, and a second lower surface 113*b*.

A space (hereinafter referred to as a first space) from the lower surface 44 to the lower surface 113*a* is formed in the first recessed portion 110, which has an opening at the lower surface 44. The first space can be a space demarcated by the first inner side surface 111*a*, the first inner side surface 111*b*, the first lower surface 113*a*, a flat plane including the lower surface 44, a flat plane including the light incident surface, and a flat plane including the light emission surface.

A space (hereinafter referred to as a second space) from the lower surface 44 to the lower surface 113*b* is formed in the second recessed portion 110*b*, which has an opening at the lower surface 44. The second space can be a space demarcated by the second inner side surface 111*c*, the second inner side surface 111*d*, the second lower surface 113*b*, the flat plane including the lower surface 44, the flat plane including the light incident surface, and the flat plane including the light emission surface.

The recessed portion 110 can be formed in a slit shape. The recessed portion 110 is formed in a slit shape including a plurality of inner side surfaces in parallel with a Z-axis direction from a bonding surface 42. The recessed portion 110 can be formed by a slit extending in the Z-axis direction. The inner side surface 111 extends in the optical member 40A between the flat plane including the light incident surface and the flat plane including the light emission surface. The recessed portion 110 can be formed by a method such as cutting, with a blade, a region in which the recessed portion 110 is desired to be formed.

A height h2 (a maximum height) from the lower surface 44 of the optical member 40A to a highest point of the lower surfaces 113*a* and 113*b* of the optical member 40A is in a range from 5% to 90% of a height h1 (height from the lower surface 44 to the upper surface 43) of the optical member 40A in a direction perpendicular to the bonding surface 42. Furthermore, the height h2 is preferably in a range from 20% to 70% of the height h1. By setting the height h2 to be equal to or more than 20% of the height h1, the space demarcated by the recessed portion 110 can be ensured with a margin. By setting the height h2 to be equal to or less than 70% of the height h1, breakage of the optical member 40A and a crack in the optical member 40A can be suppressed.

The height h1 can be in a range from 0.2 mm to 2.0 mm. Furthermore, the height h1 is preferably in a range from 0.3 mm to 1.0 mm. By setting the height h1 to be equal to or more than 0.3 mm, the light incident surface and the light emission surface can be ensured with a margin. By setting the height h1 to be equal to or less than 1.0 mm, a size of the optical member 40A can be suppressed. A width w1 of the optical member 40A in the X direction can be in a range from 0.7 mm to 5.0 mm. The height h2 from the lower surface 44 of the optical member 40A to the lower surface 113 can be in a range from 0.01 mm to 0.5 mm. A maximum width w2 of the recessed portion 110 in the X direction can be in a range from 0.05 mm to 0.5 mm. In the optical member 40A illustrated by the drawings, for example, the height h1 can be 0.5 mm, the width w1 can be 5 mm, the height h2 can be 0.2 mm, and the width w2 can be 0.15 mm.

The lower surface 44 of the optical member 40A includes a plurality of regions 41 spaced apart from each other on the flat plane including this lower surface 44. The plurality of regions 41 include a first region 41*a* and a second region 41*b*. Furthermore, the plurality of regions 41 can include a third region 41*c*. The width w2 of the recessed portion 110 is less than a width of the region 41 in the X direction.

In a plan view as seen along a direction perpendicular to the lower surface 44 of the optical member 40A, the inner side surface 111*a* is located between the first region 41*a* and the second region 41*b*. In this plan view, the inner side surface 111*b* is located between the first region 41*a* and the second region 41*b*. In this plan view, the inner side surface 111*c* is located between the second region 41*b* and the third region 41*c*. In this plan view, the inner side surface 111*d* is located between the second region 41*b* and the third region 41*c*. The direction perpendicular to the lower surface 44 of the optical member 40A is the same direction as a Y-axis direction.

In the top view, the optical member 40A can include a symbol surface extending in a long side direction. The symbol surface intersects the upper surface 43 and the outer side surface of the optical member 40A. The symbol surface can be an inclined surface inclined relative to the upper surface 43. The symbol surface can be used as a symbol for confirming an orientation of the optical member 40A when viewed in the top view. In this way, an orientation of the optical member 40A can be easily determined, and ease in mounting can be improved.

When the incident light is divided into the main light and the monitor light, intensity of the monitor light is less than intensity of the main light. For example, the partial reflective surface transmits in a range from 80% to 99.5% of incident light and reflects in a range from 0.5% to 20.0% of the incident light.

Photodetector 50

As illustrated in FIG. 7B, the photodetector 50 includes a lower surface 51, a light receiving surface 52, and a plurality of side surfaces 55. The light receiving surface 52 is located opposite to the lower surface 51. An outer shape of the photodetector 50 is a rectangular parallelepiped. Note that the outer shape may be different from the rectangular parallelepiped.

An outer shape of the light receiving surface 52 is rectangular. Note that the outer shape of the light receiving surface 52 may not be rectangular. A length of the light receiving surface 52 in the X direction is greater than a length of the light receiving surface 52 in the Z direction. A long side direction of the outer shape of the light receiving surface 52 is the same direction as the X direction, and a short side direction of the outer shape of the light receiving surface 52 is the same direction as the Z direction.

A plurality of light receiving regions 53 are provided on the light receiving surface 52. The plurality of light receiving regions 53 include a first light receiving region 53a and a second light receiving region 53b. Furthermore, the plurality of light receiving regions 53 can further include a third light receiving region 53c. The light receiving region 53 can be provided in a one-to-one relationship with the light-emitting element 20.

The plurality of light receiving regions 53 are spaced apart from each other in the light receiving surface 52. The plurality of light receiving regions 53 are aligned along a first direction. The plurality of light receiving regions 53 are disposed side by side at a predetermined interval. The first direction is the same direction as the X direction. Examples of the photodetector 50 including the light receiving surface 52 include a photoelectric conversion element (photodiode) that outputs an electrical signal in accordance with an intensity or the amount of incident light.

The photodetector 50 includes a plurality of wiring patterns 54. The plurality of wiring patterns 54 can be provided on the light receiving surface 52. Note that the plurality of wiring patterns 54 may be provided on a surface other than the light receiving surface 52, for example, on the side surface 55. The wiring pattern 54 is electrically connected to the light receiving region 53. The plurality of light receiving regions 53 are electrically connected to different wiring patterns 54.

Protective Element 60A

The protective element 60A is a circuit element for preventing breakage of a specific element (the light-emitting element 20, for example) as a result of an excessive current flowing through the element. A typical example of the protective element 60A is a voltage regulator diode such as a Zener diode. As the Zener diode, an Si diode can be employed.

Temperature Measuring Element 60B

The temperature measuring element 60B is an element used as a temperature sensor for measuring an ambient temperature. For example, a thermistor can be used as the temperature measuring element 60B.

Wiring Line 70

The wiring line 70 is formed of a conductor having a linear shape with bonding portions at both ends. In other words, the wiring line 70 includes the bonding portions bonded to other components, at both ends of the linear portion. The wiring line 70 is, for example, a metal wire. Examples of the metal include gold, aluminum, silver, copper, or the like.

Lens Member 80

The lens member 80 includes one or a plurality of lens surfaces 82. A surface 81 opposite to the lens surface 82 can be a flat plane. Note that the surface 81 may not be the flat plane. The lens member 80 collimates incident light. In the example illustrated in FIGS. 4 and 5, the lens member 80 includes one lens surface 82. The lens member 80 can be formed of a material having light transmissivity, for example, glass, plastic, or a resin.

Beam Combiner 90

The beam combiner 90 emits light multiplexed by combining a plurality of incident lights into the same axis. The beam combiner 90 can have a structure to which a plurality of optical elements 91 are bonded. The optical element 91 can be formed of a transparent material such as glass or plastic that transmits visible light. The optical element 91 is achieved by, for example, a dichroic mirror. The dichroic mirror can be formed of a dielectric multilayer film having predetermined wavelength selectivity. The dielectric multilayer film can be formed of $Ta_2O_5/SiO_2$, $TiO_2/SiO_2$, $Nb_2O_5/SiO_2$, and the like.

Next, the light-emitting device 200 will be described.

Light-Emitting Device 200

In an example of the light-emitting device 200 to be described below, each of the plurality of light-emitting elements 20 is an edge-emitting semiconductor laser element. The light-emitting device 200 includes the three light-emitting elements 20. However, the number of the light-emitting elements 20 included in the light-emitting device 200 is not limited to three.

In the example of the light-emitting device 200 illustrated by the drawings, the plurality of light-emitting elements 20, the submount 30, the optical member 40A, the photodetector 50, the plurality of protective elements 60A, and the temperature measuring element 60B are disposed in the first mounting region 18a included in the mounting surface 11M of the substrate 11. The first cap 16 surrounds the components disposed in the first mounting region 18a. The plurality of lens members 80 and the beam combiner 90 are disposed in the second mounting region 18b. The second cap 120 surrounds these components disposed in the first mounting region 18a and the second mounting region 18b.

The plurality of light-emitting elements 20 include the first light-emitting element 20a that emits first light 22a, and the second light-emitting element 20b that emits second light 22b. Furthermore, the plurality of light-emitting elements 20 may further include the third light-emitting element 20c that emits third light 22c. The plurality of light-emitting elements 20 include two or more light-emitting elements 20 that emit lights of different colors.

The plurality of light-emitting elements 20 include the first light-emitting element 20a, the second light-emitting element 20b, and the third light-emitting element 20c that emit lights of colors different from each other. The first light-emitting element 20a, the second light-emitting element 20b, and the third light-emitting element 20c emit the lights of colors different from each other that are selected from red, green, or blue. The first light-emitting element 20a emits red light, the second light-emitting element 20b emits green light, and the third light-emitting element 20c emits blue light.

The emission end surfaces of the plurality of corresponding light-emitting elements 20 are spaced apart from each other in the X direction. In the top view, the second light-emitting element 20b is located between the first light-emitting element 20a and the third light-emitting element 20c. The second light-emitting element 20b and the third light-emitting element 20c are disposed at positions spaced apart from the first light-emitting element 20a in an order of the second light-emitting element 20b and the third light-emitting element 20c. Note that the top view is the plan view as seen along the Y-axis direction.

In the top view, the plurality of light-emitting elements 20 include two light-emitting elements 20 in an arrangement relationship in which one light-emitting element 20 is inclined to the other light-emitting element 20. In the example illustrated in FIG. 5, the first light-emitting element 20a and the second light-emitting element 20b have the arrangement relationship. Further, the second light-emitting element 20b and the third light-emitting element 20c have the arrangement relationship. Further, the first light-emitting element 20a and the third light-emitting element 20c have the arrangement relationship. Note that the plurality of light-emitting elements 20 may not have such an arrangement relationship, and, for example, the plurality of light-emitting elements 20 may be disposed in parallel with each other.

In the top view, the optical axes of the lights emitted from the plurality of corresponding light-emitting elements 20 are not parallel to each other. Note that these optical axes may be parallel to each other. The two light-emitting elements 20 having the inclined arrangement relationship are inclined in an orientation in which a distance between the two light-emitting elements 20 at a spaced position away from the emission end surface toward an opposite side surface is shorter than a distance between the two light-emitting elements 20 at a position of the emission end surface. Note that the "spaced position" here refers to a position farther at a distance shorter than a length from the emission end surface to the opposite surface of one light-emitting element 20 among the two light-emitting elements 20 having a shorter length from the emission end surface to the opposite surface.

In the two light-emitting elements 20 having the inclined arrangement relationship, light traveling on the optical axis of one light-emitting element 20 travels in a direction away from the optical axis in the other light-emitting element 20.

The second light-emitting element 20b is disposed such that the optical axis (hereinafter referred to as a second optical axis) is parallel to the Z direction. The term "parallel" used here allows an error within ±2 degrees. The first light-emitting element 20a is disposed such that the optical axis (hereinafter referred to as a first optical axis) is inclined relative to the second optical axis. The third light-emitting element 20c is disposed such that the optical axis (hereinafter referred to as a third optical axis) is inclined relative to the second optical axis.

The plurality of light-emitting elements 20 are disposed on the first mounting region 18a via the submount 30. The lower surface of the submount 30 is bonded to the mounting surface 11M. The plurality of light-emitting elements 20 are each bonded to the upper surface 30M of the submount 30 via a metal adhesive such as AuSn, for example. The lower surface of the submount 30 is bonded to the mounting surface 11M via a metal adhesive such as AuSn and Au particles, for example.

In the top view, the light-emitting point of each of the plurality of light-emitting elements 20 is disposed near a side surface of the submount 30 extending in parallel with the X direction. In the light-emitting element 20, heat concentrates more near the light-emitting point than another place, and thus the emission end surface may not excessively protrude from the submount 30 in terms of heat dissipation.

The photodetector 50 is disposed in the first mounting region 18a. The lower surface of the photodetector 50 is bonded to the mounting surface 11M. Further, the optical member 40A is disposed on the light receiving surface 52 of the photodetector 50. A bonding portion 45 acquired by curing an adhesive for bonding the photodetector 50 and the optical member 40A is formed between the photodetector 50 and the optical member 40A.

It can be said that the light receiving surface 52 of the photodetector 50 is a bonding surface to which the optical member 40A is bonded, and the lower surface 44 of the optical member 40A is the bonding surface 42 to which the photodetector 50 is bonded. Hereinafter, description will be given with the former bonding surface as a first bonding surface and the latter bonding surface as a second bonding surface for a distinction.

The first bonding surface 52 and the second bonding surface 42 are bonded via the bonding portion 45. The bonding portion 45 is in contact with the first bonding surface 52, the second bonding surface 42, and the inner side surface 111. "The bonding portion 45 is in contact with the inner side surface 111" means that the adhesive enters the space demarcated by the recessed portion 110. This makes it possible to suppress the amount of adhesive sticking out from the outer side surface of the optical member 40A, which leads to providing a light-emitting device having stable quality. When the amount of adhesive sticking out increases, a situation where the adhesive unexpectedly adheres to another component and the bonding portion 45 interferes with the light emitted from the light-emitting element 20 can occur. Furthermore, a contact area of the optical member 40A with the adhesive increases, and thus occurrence of poor bonding can be suppressed. It can be said that the recessed portion 110 serves as an escape portion of the adhesive.

The bonding portion 45 is in contact with the first inner side surface 111a and the first inner side surface 111b of the first recessed portion 110a. The bonding portion 45 is in contact with the second inner side surface 111c and the second inner side surface 111d of the second recessed portion 110b.

The bonding portion 45 is in contact with at least a part of the inner side surface 111. The bonding portion 45 is not necessarily in contact with the entire inner side surface 111. The bonding portion 45 can be in contact with the entire inner side surface 111 due to a relationship with the amount of the adhesive and an applied position of the adhesive.

It is desirable that the bonding portion 45 is not in contact with the lower surface 113 of the optical member 40A and is not in contact with at least the highest point of the lower surface 113. When the bonding portion 45 is in contact with the highest point of the lower surface 113, the recessed portion 110 is filled with the adhesive, and thus an excessive adhesive may have been used. In this case, the amount of adhesive sticking out may not be sufficiently suppressed. Note that the bonding portion 45 may be in contact with the lower surface 113.

As an exemplary guide for suppressing excessive adhesive sticking out, it is conceivable to set the height h2 of the optical member 40A to be equal to or more than 20% of the height h1. Furthermore, when the height h2 increases, a thickness between the upper surface 43 and the lower surface 113 is accordingly thinner, and thus the height h2 does not need to be excessively increased. As an exemplary guide, it is conceivable to set the height h2 to be equal to or less than 70% of the height h1.

The bonding portion 45 is present between an imaginary flat plane (for example, the imaginary flat plane PL in FIG. 7B) and the bonding surface 42 and is not arranged above the imaginary flat plane. The imaginary flat plane is parallel to the bonding surface 42 and passes through a middle point (for example, the middle point M in FIG. 7B) of the height (the height h1) of the optical member 40A in the direction perpendicular to the second bonding surface 42. Note that the direction perpendicular to the second bonding surface 42 is the same direction as the Y direction.

In the light-emitting device 200, the amount of usage of the adhesive forming the bonding portion 45 with the shape of the recessed portion 110 is preferably set such that a height h3 of the bonding portion 45 is in a range from 20% to 80% of the height h2. A light-emitting device having stable quality can be manufactured by increasing an adhesion area and suppressing adhesive sticking out.

In the top view, a length of the optical member 40A in the Z direction can be set in a range from 80% to 120% of a length of the photodetector 50 in the Z direction. It is desirable that the length of the optical member 40A in the Z direction and the length of the photodetector 50 in the Z direction are the same. In consideration of member tolerance, it can be said that the "same" used here is in a range from 90% to 110%. By making the length of the optical member 40A and the photodetector 50 in the Z direction the same, a length of the light-emitting device 200 in the Z direction can be suppressed, and a reduction in size of the device can be achieved.

In the top view, a length of the optical member 40A in the X direction is less than a length of the photodetector 50 in the X direction. The photodetector 50 includes an extension region 56 extending in a second direction from a region to which the optical member 40A is bonded. The second direction is the same direction as the X direction. In the top view, the extension region 56 extends from each of the two outer side surfaces of the optical member 40A. For a distinction, the extension region 56 extending in the X direction (−X direction) from one outer side surface of the two outer side surfaces is referred to as a first extension region 56a, and the extension region 56 extending in the X direction (+X direction) from the other outer side surface of the two outer side surfaces is referred to as a second extension region 56b. Note that, here, indicating the "+X direction" and the "−X direction" intends that both of the directions are parallel to the X-axis but traveling directions thereof are opposite to each other. For example, the +X direction and the −X direction can be distinguished from each other by setting one of the +X direction and −X direction as the second direction and setting the other of the +X direction and −X direction as a third direction (direction opposite to the second direction).

The plurality of wiring patterns 54 of the photodetector 50 are arranged in the extension region 56. The plurality of wiring patterns 54 include one or more wiring patterns 54 arranged in the first extension region 56a, and one or more wiring patterns 54 arranged in the second extension region 56b.

In the top view, the wiring pattern 54 is arranged at a position spaced apart from the optical member 40A by a predetermined distance. In the top view, the wiring pattern 54 is not provided in a region of the extension region 56 within the predetermined distance from the optical member 40A. The predetermined distance is less than a length of the region 41 in the X direction.

In the top view, the wiring pattern 54 provided in the first extension region 56a is provided in a position spaced apart from one of the two outer side surfaces of the optical member 40A by the predetermined distance in the −X direction. In the top view, the wiring pattern 54 provided in the second extension region 56b is provided in a position spaced apart from the other of the two outer side surfaces of the optical member 40A by the predetermined distance in the +X direction.

A resin adhesive having light transmissivity can be used as the adhesive forming the bonding portion 45. Note that the adhesive is not limited to the resin adhesive, and another adhesive having light transmissivity in a cured state can also be used.

In the top view, the bonding portion 45 can include a portion sticking out from the lower surface 44 of the optical member 40A. The bonding portion 45 is preferably formed so as to cover at least the plurality of light receiving regions 53 of the photodetector 50. The reason is that, when a region that is not partially in contact with the bonding portion 45 in the light receiving region 53 is generated, light traveling in a direction from the optical member 40A toward the light receiving region 53 can be unexpectedly reflected or refracted and cannot reach the light receiving region 53.

By providing the wiring pattern 54 in the position spaced apart from the optical member 40A by the predetermined distance, the light-emitting device 200 can be manufactured such that the adhesive sticking out from the lower surface 44 of the optical member 40A does not reach the wiring pattern 54. In a case in which the bonding portion 45 is formed on the wiring pattern 54, trouble may unexpectedly occur when the wiring line 70 is bonded to the wiring pattern 54.

The bonding portion 45 is provided on the first bonding surface 52 of the photodetector 50 from the region to which the optical member 40A is bonded to the extension region 56 and is not provided in the extension region 56 in a position spaced apart from the optical member 40A by the predetermined distance or longer in the plan view as seen along a direction perpendicular to the first bonding surface 52. Note that the direction perpendicular to the first bonding surface 52 is the same direction as the Y direction.

Each of the plurality of light-emitting elements 20 emits light traveling from the emission end surface to the optical member 40A. The light emitted from each of the plurality of light-emitting elements 20 passes through the optical member 40A. The light is incident on the light incident surface of the optical member 40A. The light incident to the light incident surface is emitted from the light emission surface of the optical member 40A.

Divergent light can be emitted from the light emission surface of the optical member 40A. An irradiation range in the light emission surface is greater than an irradiation range in the light incident surface of the light emitted from the light-emitting element 20. The adhesive enters the recessed portion 110, and thus the adhesive sticking out from the light emission surface can be suppressed. When the amount of adhesive sticking out increases, the bonding portion 45 may partially overlap the irradiation range of the light in the light emission surface, and the bonding portion 45 may unexpectedly refract or reflect the light. The optical member 40A including the recessed portion 110 can be expected to have an effect of suppressing occurrence of such trouble. Note that such an effect is not limited to a case in which the light emitted from the light emission surface is the divergent light.

The partial reflective surface of the optical member 40A reflects a part of light emitted from each of the plurality of light-emitting elements 20 and incident to the light incident surface and transmits the remaining light. The light transmitted through the partial reflective surface of the optical member 40A is emitted from the light emission surface, and the light reflected by the partial reflective surface is emitted from the second bonding surface 42.

A part of the first light 22a emitted from the first light-emitting element 20a passes through the first region 41a. A part of the second light 22b emitted from the second light-emitting element 20b passes through the second region 41b. A part of the third light 22c emitted from the third light-emitting element 20c passes through the third region 41c.

The photodetector 50 receives a part of the light emitted from each of the plurality of light-emitting elements 20. In the light receiving region 53 provided in the light receiving surface 52, the photodetector 50 receives a part of the light emitted from the light-emitting element 20.

A part of the first light 22a emitted from the first light-emitting element 20a is received in the first light receiving region 53a. A part of the second light 22b emitted from the second light-emitting element 20b is received in the second light receiving region 53b. A part of the third light 22c emitted from the third light-emitting element 20c is received in the third light receiving region 53c.

In the top view, the light receiving region 53 is disposed in a position through which the optical axis of the light-emitting element 20 passes. In the top view, the first light receiving region 53a is disposed in a position through which the optical axis of the first light-emitting element 20a passes, the second light receiving region 53b is disposed in a position through which the optical axis of the second light-emitting element 20b passes, and the third light receiving region 53c is disposed in a position through which the optical axis of the third light-emitting element 20c passes.

In the top view, the optical member 40A is bonded to the photodetector 50 such that the first region 41a overlaps the first light receiving region 53a and does not overlap the second light receiving region 53b. Furthermore, the optical member 40A is bonded to the photodetector 50 such that the first region 41a does not overlap the third light receiving region 53c.

In the top view, the optical member 40A is bonded to the photodetector 50 such that the second region 41b overlaps the second light receiving region 53b and does not overlap the first light receiving region 53a. Furthermore, the optical member 40A is bonded to the photodetector 50 such that the second region 41b does not overlap the third light receiving region 53c.

In the top view, the optical member 40A is bonded to the photodetector 50 such that the third region 41c overlaps the third light receiving region 53c and does not overlap the second light receiving region 53b. Furthermore, the optical member 40A is bonded to the photodetector 50 such that the third region 41c does not overlap the first light receiving region 53a.

A distance between the optical axes of the first light-emitting element 20a and the second light-emitting element 20b at a position of the light incident surface of the optical member 40A is greater than a distance between the optical axes of the first light-emitting element 20a and the second light-emitting element 20b at a position of the emission end surface. The two light-emitting elements 20 are inclined to each other, and thus a distance between two light receiving regions in the photodetector 50 can be increased. In this way, a region in which the recessed portion 110 is to be provided in the optical member 40A can be easily ensured. A greater width w2 of the recessed portion in the X direction can cause the adhesive to easily enter the recessed portion 110 and can contribute to stabilization of quality of a light-emitting device.

In the top view, an inclination angle of the first light-emitting element 20a relative to the second light-emitting element 20b can be in a range from 50% to 500% of the spread angle in a direction parallel to the emission end surface of the light emitted from the first light-emitting element 20a. In the top view, an inclination angle of the third light-emitting element 20c relative to the second light-emitting element 20b can be in a range from 50% to 500% of the spread angle in a direction parallel to the emission end surface of the light emitted from the third light-emitting element 20c. In the illustrated light-emitting device 200, the spread angle in the direction parallel to the emission end surface is the slow-axis spread angle. Note that a value of the spread angle here is a value of a half angle for comparison with the inclination angle. By setting the inclination angle to be equal to or more than 50% with respect to the spread angle of light, the width w2 of the recessed portion 110 can be easily ensured while disposing the plurality of light-emitting elements 20 in close proximity. By setting the inclination angle to be equal to or less than 500% with respect to the spread angle of light, a size of the light-emitting device 200 in the X direction can be suppressed while ensuring the width w2 of the recessed portion 110.

In the light-emitting device 200, the length of the optical member 40A in the X direction can be greater than a length of the submount 30 in the X direction, and the length of the photodetector 50 in the X direction can be greater than the length of the optical member 40A in the X direction. In this way, a reduction in size of the light-emitting device 200 can be achieved by a relationship with the wiring region 14 to be described below.

The first inner side surface 111a is arranged in a position through which a first imaginary line does not pass. The first imaginary line is an imaginary straight line that coincides with an optical path at an outer edge of the main portion of the first light 22a closest to the first inner side surface 111a and incident to the light incident surface of the optical member 40A and reaching the partial reflective surface.

The first inner side surface 111a is arranged in a position through which a second imaginary line does not pass. The second imaginary line is an imaginary straight line that coincides with an optical path at an outer edge of the main portion of the second light 22b closest to the first inner side surface 111a and incident to the light incident surface of the optical member 40A and reaching the partial reflective surface. Furthermore, the first inner side surface 111b is provided in a position through which the first imaginary line and the second imaginary line do not pass.

The second inner side surface 111c is arranged in a position through which a third imaginary line does not pass. The third imaginary line is an imaginary straight line that coincides with an optical path at the outer edge of the main portion of the second light 22b closest to the second inner side surface 111c and incident to the light incident surface of the optical member 40A and reaching the partial reflective surface.

The second inner side surface 111c is arranged in a position through which a fourth imaginary line does not pass. The fourth imaginary line is an imaginary straight line that coincides with an optical path at an outer edge of the main portion of the third light 22c closest to the second inner side surface 111c and incident to the light incident surface of the optical member 40A and reaching the partial reflective surface. Furthermore, the second inner side surface 111d is arranged in a position through which the third imaginary line and the fourth imaginary line do not pass.

The plurality of wiring regions 14 can be provided in a region on the mounting surface 11M located laterally in the X direction relative to the submount 30. The plurality of wiring regions 14 include the wiring region 14 electrically connected to at least one of the plurality of light-emitting elements 20. The plurality of wiring regions 14 include the wiring region 14 in which the protective element 60A is disposed. The plurality of wiring regions 14 include the wiring region 14 in which the temperature measuring element 60B is disposed.

The light-emitting element 20 is electrically connected to two wiring regions 14 via the corresponding wiring lines 70. The temperature measuring element 60B is disposed on one wiring region 14 of the two wiring regions 14 and is electrically connected to the other wiring region 14 of the two wiring regions 14 via the wiring line 70.

The first cap 16 is mounted on the mounting surface 11M. The first cap 16 is bonded to the peripheral region 11P surrounding the first mounting region 18a. The plurality of light-emitting elements 20 are hermetically sealed by the substrate 11 and the first cap 16. By hermetically sealing the space in which the light-emitting element 20 is disposed, a deterioration in quality due to dust gathering can be suppressed.

The light emitted from each of the plurality of light-emitting elements 20 is incident on the optical member 40A, and a part of the light is reflected by the partial reflective surface, is incident on the light receiving region 53, and is received in the photodetector 50. The light incident on the light receiving region 53 is used as the monitor light. Another part of the light incident on the optical member 40A is transmitted through the partial reflective surface and is emitted from the light emission surface toward the side wall portion 12 of the package 10. The light emitted from the light emission surface of the optical member 40A is incident on the light incident surface 10A of the side wall portion 12, is transmitted through the light-transmissive region, and is emitted from the light extraction surface 10B.

In the light-emitting device 200, the lens member 80 is disposed in the second mounting region 18b of the substrate 11. The beam combiner 90 is disposed in the second mounting region 18b of the substrate 11. Here, in the Z direction, relative to the plurality of light-emitting elements 20, a direction facing the side wall portion 12 on which light emitted from each of the plurality of light-emitting elements 20 is incident is referred to as front of a member, and a direction facing the side wall portion 12 located opposite to the side wall portion 12 on which the light is incident is referred to as rear of the member. The light-emitting element 20, the lens member 80, and the beam combiner 90 are disposed in this order from the rear to the front in the Z direction. The lens member 80 is disposed in front of the light-emitting element 20, and receives the light emitted from the light-emitting element 20. The beam combiner 90 is disposed in front of the lens member 80, and receives the light emitted from the lens member 80.

The plurality of lights incident on the beam combiner 90 are combined onto the same axis, and the multiplexed light is emitted from the beam combiner 90. The multiplexed light emitted from the beam combiner 90 is transmitted through an incident surface of the lid member 130 and is emitted from an emission surface of the lid member 130 to the outside of the light-emitting device 200.

Second Embodiment

Figure 8A:
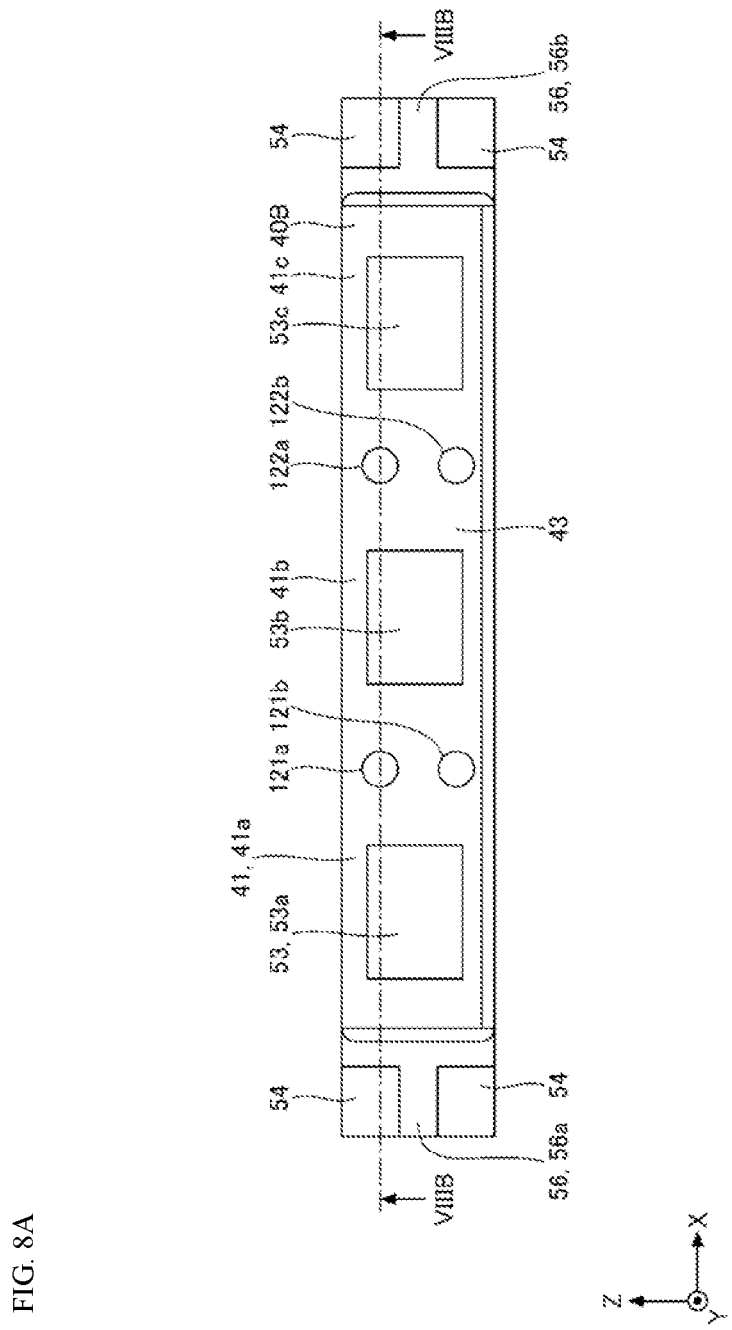
FIG. 8A is a top view of an optical member and a photodetector according to a second embodiment.
Figure 8B:
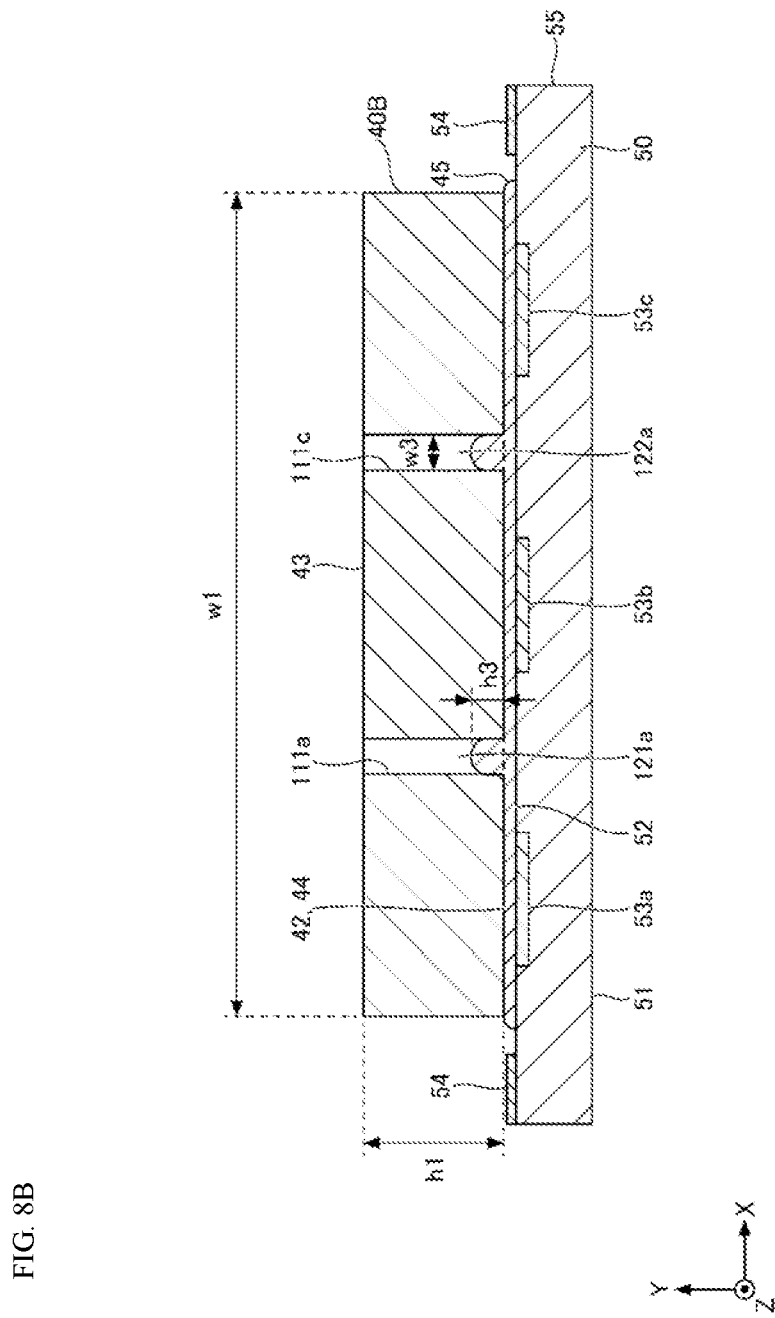
FIG. 8B is a cross-sectional view of the optical member and the photodetector taken along a section line in FIG. 8A.

A light-emitting device 300 according to a second embodiment will be described. A schematic structure of a main portion according to the second embodiment will be described with reference to FIGS. 8A and 8B. FIG. 8A is a top view of an optical member and a photodetector according to the second embodiment. FIG. 8B is a cross-sectional view of the optical member and the photodetector taken along a section line VIIIB-VIIIB in FIG. 8A. Note that, in the second embodiment, an optical member 40B being a modification example of the optical member 40A according to the first embodiment will be described. Thus, because a configuration other than the optical member 40B is the same as the configuration described in the light-emitting device 200 according to the first embodiment, description thereof will be omitted.

In the first embodiment, the recessed portion 110 having the slit shape is formed in the optical member 40A, but, in the second embodiment, a plurality of through holes 121a and 121b each having a cylindrical shape are defined as the recessed portion 110 in the optical member 40B. Furthermore, a plurality of through holes 122a and 122b each having a cylindrical shape are defined as the recessed portion 110 in the optical member 40B. In other words, in the present description, a word of the recessed portion 110 is used as a word widely including a shape that demarcates a space recessed upward from the lower surface 44 and is also used as a word including a shape penetrating from the lower surface 44 of the optical member 40A to the upper surface 43 of the optical member 40A such as the through hole 121a.

In a plan view as seen along a direction (Y-axis direction) perpendicular to the bonding surface 42, the through holes 121a and 121b are arranged between a first region 41a and a second region 41b. In the plan view as seen along the direction (Y-axis direction) perpendicular to the bonding surface 42, the through holes 122a and 122b are arranged between the second region 41b and a third region 41c.

For example, a diameter w3 of a circular cross-section of each of the through holes 121a and 121b having the cylindrical shape is 0.15 mm. The diameter w3 of the circular cross-section of each of the through holes 122a and 122b is 0.15 mm. Note that, in FIGS. 8A and 8B, the two through holes 121a and 121b are formed between the first region 41a and the second region 41b, and the two through holes 122a and 122b are formed between the second region 41b and the third region 41c, but one through hole may be formed, or three or more through holes may be formed.

Third Embodiment

Figure 9A:
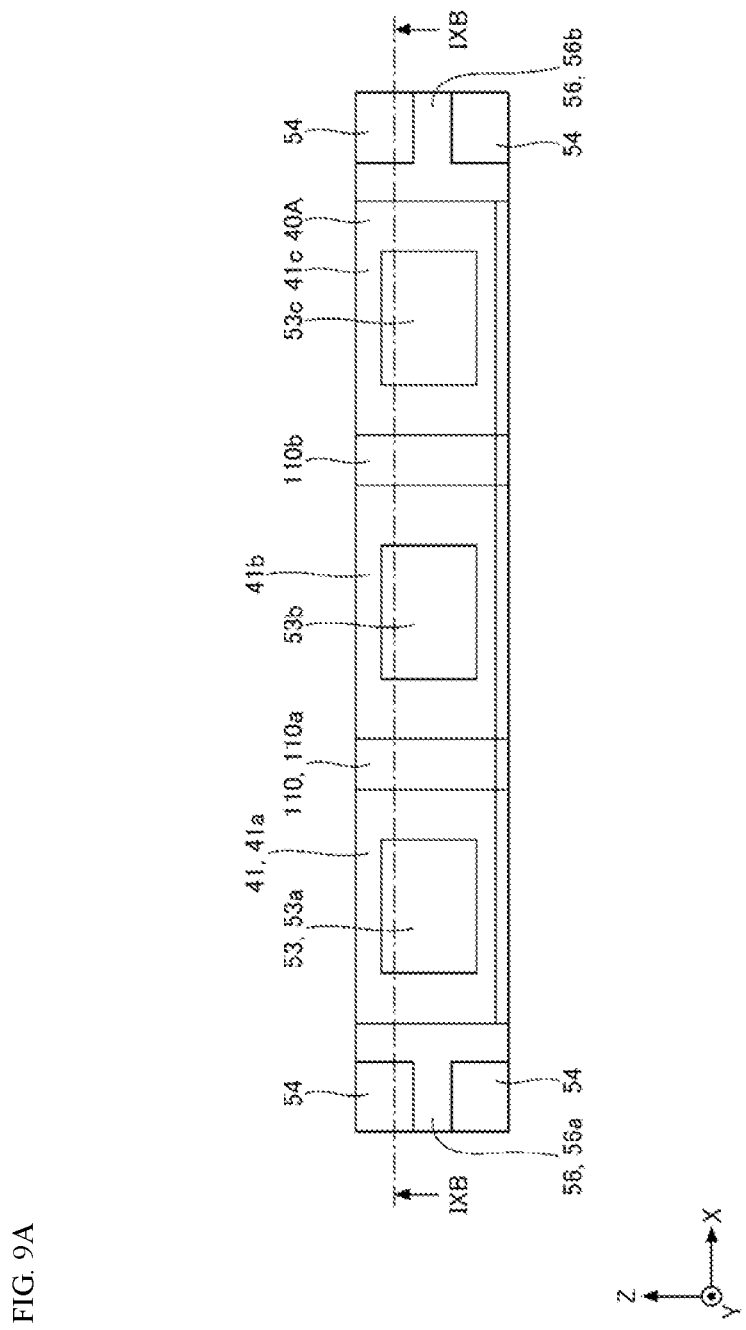
FIG. 9A is a top view of an optical member and a photodetector according to a third embodiment.
Figure 9B:
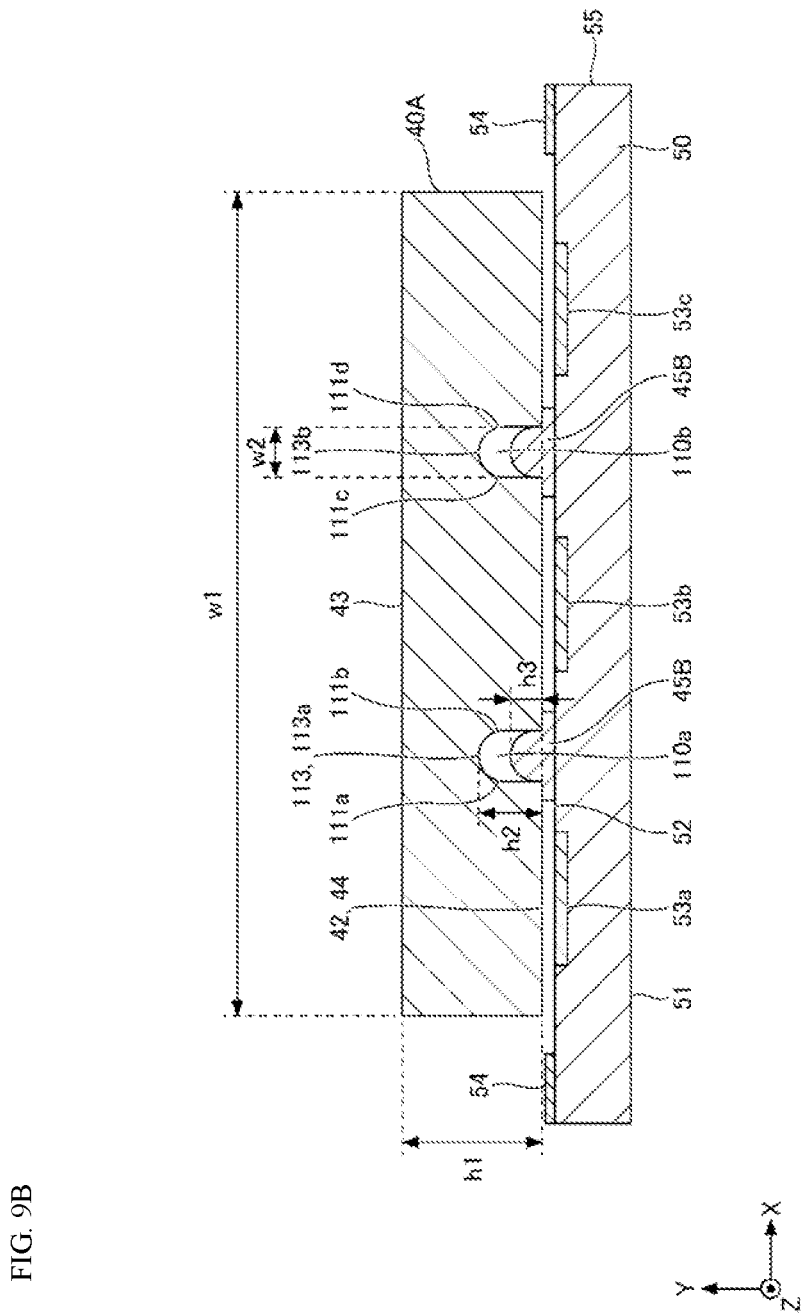
FIG. 9B is a cross-sectional view of the optical member and the photodetector taken along a section line IXB-IXB in FIG. 9A.

A light-emitting device 400 according to a third embodiment will be described. A schematic structure of a main portion according to the third embodiment will be described with reference to FIGS. 9A and 9B. FIG. 9A is a top view of an optical member and a photodetector according to the third embodiment. FIG. 9B is a cross-sectional view of the optical member and the photodetector taken along a section line IXB-IXB in FIG. 9A. Note that, in the third embodiment, a bonding portion 45B formed of an adhesive between an optical member 40A and a photodetector 50 is different from the bonding portion 45 according to the first embodiment. Because a configuration other than the bonding portion 45B is the same as the configuration described in the light-emitting device 200 according to the first embodiment, description thereof will be omitted.

In the light-emitting device 200 according to the first embodiment, the adhesive reaches a surface of the light receiving region 53 of the photodetector 50, and the bonding portion 45 covers the light receiving region 53, but, in the light-emitting device 400 according to the third embodiment, the bonding portion 45B is not formed directly above a light receiving region 53. In the top view, the bonding portion 45B is formed so as not to overlap any of a plurality of the light receiving regions 53. In this way, the amount of usage of the adhesive can be further reduced than when the bonding portion 45 is formed so as to cover the light receiving region 53. Furthermore, by reducing the amount of usage of the adhesive, the amount of adhesive sticking out can also be suppressed.

For example, the bonding portion 45B can be formed by applying the adhesive to a position in which the recessed portion 110 of the optical member 40A is disposed on a first bonding surface 52 of the photodetector 50, and then bonding the first bonding surface 52 and a second bonding surface 42.

Fourth Embodiment

Figure 10A:
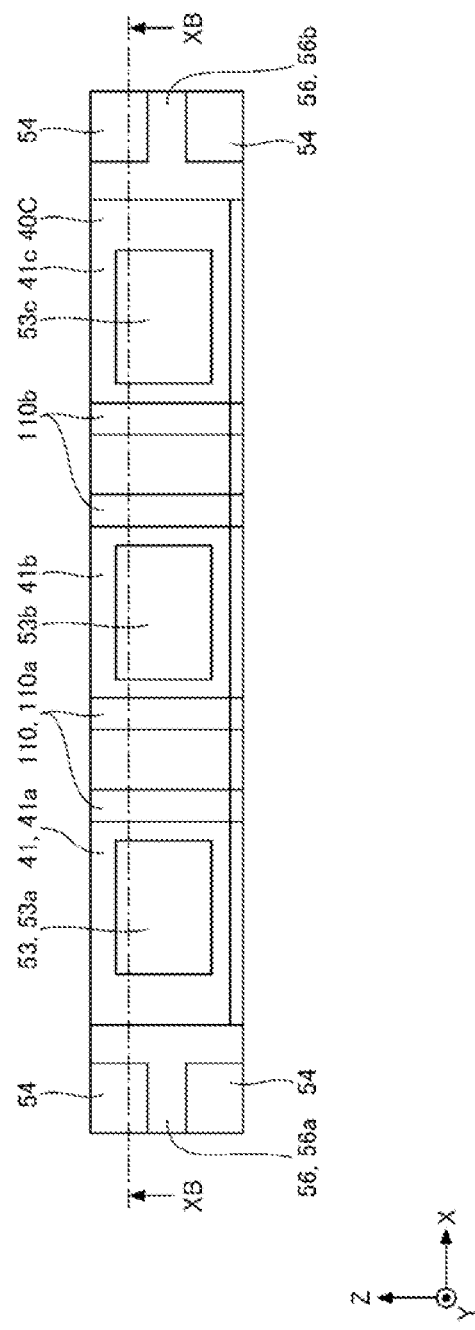
FIG. 10A is a top view of an optical member and a photodetector according to a fourth embodiment.
Figure 10B:
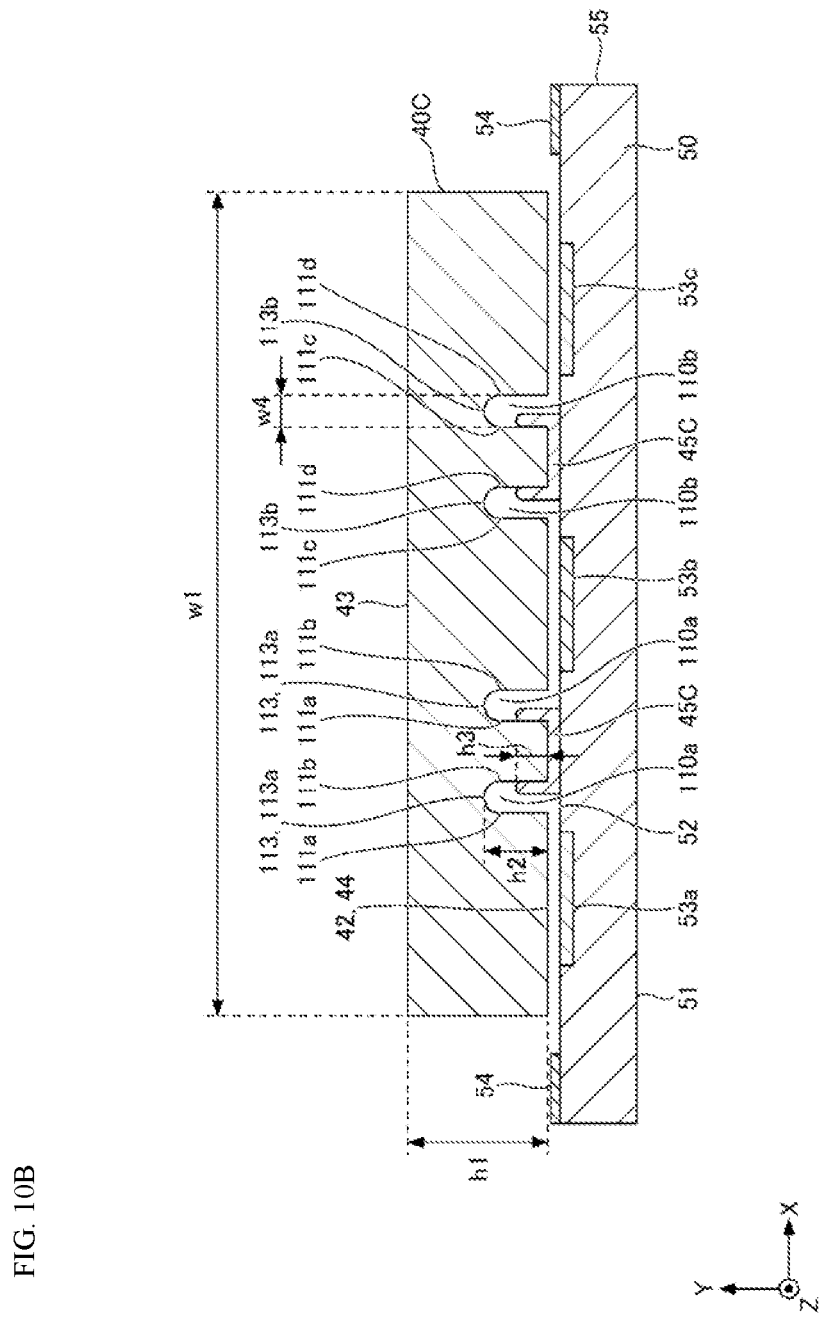
FIG. 10B is a cross-sectional view of the optical member and the photodetector taken along a section line XB-XB in FIG. 10A.

A light-emitting device 500 according to a fourth embodiment will be described. A schematic structure of a main portion according to the fourth embodiment will be described with reference to FIGS. 10A and 10B. FIG. 10A is a top view of an optical member and a photodetector according to the fourth embodiment. FIG. 10B is a cross-sectional view of the optical member and the photodetector taken along a section line XB-XB in FIG. 10A. Note that, in the fourth embodiment, an optical member 40C being a modification example of the optical member 40A according to the first embodiment will be described. Furthermore, a bonding portion 45C formed of an adhesive between the optical member 40C and a photodetector 50 will be described. Because a configuration other than the optical member 40C and the bonding portion 45C is the same as the configuration described in the light-emitting device 200 according to the first embodiment, description thereof will be omitted. Note that a maximum width w4 of a recessed portion 110 according to the fourth embodiment in the X direction can be in a range from 0.05 mm to 0.5 mm.

In the first embodiment, one recessed portion 110 having the slit shape is formed between adjacent light receiving regions 53 in the top view, but, in the fourth embodiment, two recessed portions 110 each having the slit shape are formed between adjacent light receiving regions 53 in the top view. Furthermore, the two recessed portions 110 are provided side by side in the same direction as a direction in which the light receiving regions 53 are disposed side by side.

The optical member 40C and the photodetector 50 are bonded such that two first recessed portions 110a are disposed between the first light receiving region 53a and the second light receiving region 53b, and two second recessed portions 110b are disposed between the second light receiving region 53b and the third light receiving region 53c. An interval between the two first recessed portions 110a in the X direction is less than a width of the first light receiving region 53a in the X direction. An interval between the two second recessed portions 110b in the X direction is less than a width of the third light receiving region 53c in the X direction.

A first recessed portion 110a closer to the first light receiving region 53a among the two first recessed portions 110a includes a first inner side surface 111a and a first inner side surface 111b, and the first inner side surface 111a is closer to the first light receiving region 53a than the first inner side surface 111b. Furthermore, a first recessed portion 110a farther from the first light receiving region 53a among the two first recessed portions 110a includes the first inner side surface 111a and the first inner side surface 111b, and the first inner side surface 111a is closer to the first light receiving region 53a than the first inner side surface 111b.

A second recessed portion 110b closer to the second light receiving region 53b among the two second recessed portions 110b includes a second inner side surface 111c and a second inner side surface 111d, and the second inner side surface 111c is closer to the second light receiving region 53b than the second inner side surface 111d. Furthermore, a second recessed portion 110b farther from the second light receiving region 53b among the two second recessed portions 110b includes the second inner side surface 111c and a second inner side surface 111d, and the second inner side surface 111c is closer to the second light receiving region 53b than the second inner side surface 111d.

Similar to the bonding portion 45B according to the third embodiment, the bonding portion 45C is not formed directly above the light receiving region 53. Furthermore, the bonding portion 45C is in contact with the first inner side surface 111b of the first recessed portion 110a closer to the first light receiving region 53a, and the first inner side surface 111a of the first recessed portion 110a farther from the first light receiving region 53a, among the two first recessed portions 110a. The bonding portion 45C is in contact with a lower surface 44 sandwiched between the two first recessed portions 110a. The bonding portion 45C is continuously in contact with the first inner side surface 111b, the first inner side surface 111a, and the lower surface 44. In this way, the optical member 40C can be stably bonded to the photodetector 50.

The bonding portion 45C is not in contact with the first inner side surface 111a of the first recessed portion 110a closer to the first light receiving region 53a, and the first inner side surface 111b of the first recessed portion 110a farther from the first light receiving region 53a, among the two first recessed portions 110a. By providing the adhesive so as to form such a bonding portion 45C, the optical member 40C can be bonded to the photodetector 50 such that the adhesive does not extend to the light receiving region 53. Note that the bonding portion 45C may be in contact with the first inner side surface 111a of the first recessed portion 110a closer to the first light receiving region 53a and the first inner side surface 111b of the first recessed portion 110a farther from the first light receiving region 53a.

When the bonding portion 45C is in contact with both of two first inner side surfaces 111 of the first recessed portion 110a, an area in which the bonding portion 45C is in contact with the first inner side surface 111a of the first recessed portion 110a closer to the first light receiving region 53a among the two first recessed portions 110a is preferably less than an area in which the bonding portion 45C is in contact with the first inner side surface 111b of this first recessed portion 110a. Furthermore, an area in which the bonding portion 45C is in contact with the first inner side surface 111a of the first recessed portion 110a farther from the first light receiving region 53a among the two first recessed portions 110a is preferably greater than an area in which the bonding portion 45C is in contact with the first inner side surface 111b of this first recessed portion 110a. By forming the bonding portion 45C in such a manner, the bonding portion 45C partially covering the light receiving region 53 can be easily avoided.

The bonding portion 45C is in contact with the second inner side surface 111d of the second recessed portion 110b closer to the second light receiving region 53b, and the second inner side surface 111c of the second recessed portion 110b farther from the second light receiving region 53*b*, among the two second recessed portions 110*b*. The bonding portion 45C is in contact with the lower surface 44 sandwiched between the two second recessed portions 110*b*. The bonding portion 45C is continuously in contact with the second inner side surface 111*d*, the second inner side surface 111*c*, and the lower surface 44. In this way, the optical member 40C can be stably bonded to the photodetector 50.

The bonding portion 45C is not in contact with the second inner side surface 111*c* of the second recessed portion 110*b* closer to the second light receiving region 53*b*, and the second inner side surface 111*d* of the second recessed portion 110*b* farther from the second light receiving region 53*b*, among the two second recessed portions 110*b*. By providing the adhesive so as to form such a bonding portion 45C, the optical member 40C can be bonded to the photodetector 50 such that the adhesive does not extend to the light receiving region 53. Note that the bonding portion 45C may be in contact with the second inner side surface 111*c* of the second recessed portion 110*b* closer to the second light receiving region 53*b* and the second inner side surface 111*d* of the second recessed portion 110*b* farther from the second light receiving region 53*b*.

When the bonding portion 45C is in contact with both of two second inner side surfaces 111 of the second recessed portion 110*b*, an area in which the bonding portion 45C is in contact with the second inner side surface 111*c* of the second recessed portion 110*b* closer to the second light receiving region 53*b* among the two second recessed portions 110*b* is preferably less than an area in which the bonding portion 45C is in contact with the second inner side surface 111*d* of this second recessed portion 110*b*. Furthermore, an area in which the bonding portion 45C is in contact with the second inner side surface 111*c* of the second recessed portion 110*b* farther from the second light receiving region 53*b* among the two second recessed portions 110*b* is preferably greater than an area in which the bonding portion 45C is in contact with the second inner side surface 111*d* of this second recessed portion 110*b*. By forming the bonding portion 45C in such a manner, the bonding portion 45C partially covering the light receiving region 53 can be easily avoided.

For example, the bonding portion 45C can be formed by applying the adhesive to a position in which the lower surface 44 sandwiched between the two first recessed portions 110*a* of the optical member 40C is disposed on a first bonding surface 52 of the photodetector 50, and then bonding the first bonding surface 52 and a second bonding surface 42.

Head-Mounted Display

Figure 11:
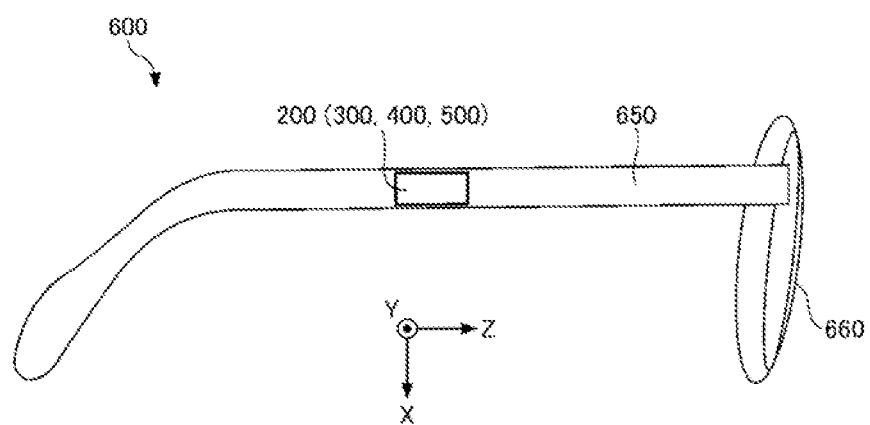
FIG. 11 is a side view schematically illustrating a configuration example of a head-mounted display according to the embodiment of the present disclosure.

FIG. 11 is a side view schematically illustrating a configuration example of a head-mounted display 600 including the light-emitting device 200 (300, 400, or 500) according to the embodiments of the present disclosure. Hereinafter, the light-emitting device 200 will be described as an example, but the head-mounted display 600 may include the light-emitting devices 300, 400, or 500 instead of the light-emitting device 200. The head-mounted display 600 includes a temple 650 and a waveguide 660 connected to the temple 650. The waveguide 660 includes a light emission region such as a diffraction grating, for example. Laser light incident on the waveguide 660 can be emitted from the light emission region of the waveguide 660 toward a retina of an eye of a user.

One end of the temple 650 is located proximate to the waveguide 660, in other words, proximate to a nose of the user, and the other end of the temple 650 is located opposite to the waveguide 660, in other words, proximate to an ear of the user. In FIG. 11, directions toward both ends of the temple 650 are parallel to a direction of the optical axis of the light emitted from the light-emitting device 200. In the illustrated by the drawings, the X, Y, and Z directions of the light-emitting device 200 in FIG. 1 match the X, Y, and Z directions of the light-emitting device 200 in FIG. 11. Based on a user wearing the head-mounted display 600, the direction of the optical axis is substantially parallel to a direction from an ear toward an eye of the user (or vice versa) in the side view.

In the example of the head-mounted display 600 illustrated in FIG. 11, the light-emitting device 200 is supported inside the temple 650. In FIG. 11, the light-emitting device 200 is described as being visible on a side surface, but the light-emitting device 200 is actually in a state where an appearance is not visually recognized from the outside. For example, the size, in the X direction, of the light-emitting device 200 illustrated in FIG. 1 is in a range from 3 mm to 15 mm and is less than the size, in the Z direction (an extending direction of the temple 650 in FIG. 11), of the light-emitting device 200.

The light-emitting device 200 is preferably mounted on the head-mounted display 600 such that the direction of the optical axis of the light emitted from the light-emitting device 200 and the extending direction of the temple of the head-mounted display 600 are parallel to each other. A width of the temple 650 in the X direction can be reduced by the light-emitting device 200 reduced in size in a direction perpendicular to the optical axis. As illustrated, a length of the temple 650 has a length that ensures a distance from an eye to an ear of a user, and thus, as long as the size in the direction of the optical axis of the light emitted from the light-emitting device 200 is small to a certain extent, the size in the direction of the optical axis of the light emitted from the light-emitting device 200 does not contribute to a reduction in size of the head-mounted display 600 even when the size in the direction of the optical axis of the light emitted from the light-emitting device 200 is further reduced.

In this embodiment, from the light-emitting device 200, a collimated beam of each of the first light 22*a*, the second light 22*b*, and the third light 22*c* can be emitted from a narrow region onto the same axis. The first light 22*a*, the second light 22*b*, and the third light 22*c* are a laser beam of any color of red, green, and blue. The laser beam of each color is scanned by a MEMS element such as a micromirror, for example, and travels inside the waveguide 660, and then forms an image on a retina of a user. Display of a color image may be performed by a field sequential method. In that case, the first light 22*a*, the second light 22*b*, and the third light 22*c* are sequentially emitted. In order to monitor intensity of the first light 22*a*, the second light 22*b*, and the third light 22*c*, the photodetector 50 included in the light-emitting device 200 can be used, for example. Note that the light-emitting device 200 (300, 400, or 500) may be disposed on the head-mounted display 600 such that the Y direction and the X direction in FIG. 11 match the X direction and the Y direction in FIG. 1, respectively.

Although the embodiments according to the present invention have been described above, the light-emitting device according to the present invention is not strictly limited to the light-emitting devices of the embodiments. In other words, the present invention can be achieved without being limited to the external shape or structure of the light-emitting device disclosed by each of the embodiments. For example, a light-emitting device that does not include a protective element may be applicable. Furthermore, it can be applied without requiring all the components being sufficiently provided. For example, in a case in which some of the components of the light-emitting device disclosed by the embodiments are not stated in the scope of the claims, the degree of freedom in design by those skilled in the art such as substitutions, omissions, shape modifications, and material changes for those components is allowed, and then the invention stated in the scope of the claims being applied to those components is specified.

The light-emitting device according to each of the embodiments can be used for a head-mounted display, a projector, lighting, a display, and the like.

What is claimed is:

1. A light-emitting device comprising:
   a plurality of light-emitting elements including a first light-emitting element configured to emit first light and a second light-emitting element configured to emit second light;
   a photodetector configured to receive a part of light emitted from each of the plurality of light-emitting elements, the photodetector having a first bonding surface;
   an optical member having a second bonding surface and a first inner side surface, the second bonding surface being bonded to the first bonding surface of the photodetector, the first inner side surface being continuous from the second bonding surface, and the light emitted from each of the plurality of light-emitting elements being configured to pass through the optical member; and
   a bonding portion bonding the photodetector and the optical member with the bonding portion being in contact with the first bonding surface, the second bonding surface, and at least a part of the first inner side surface.

2. The light-emitting device according to claim 1, wherein the optical member has a first lower surface intersecting an upper side of the first inner side surface, the first lower surface and the first inner side surface defining a first space having an opening at the second bonding surface, and
   a maximum height from the second bonding surface to the first lower surface is in a range from 20% to 70% of a height of the optical member in a direction perpendicular to the second bonding surface.

3. The light-emitting device according to claim 1, wherein a part of the bonding portion is arranged between an imaginary flat plane and the second bonding surface, and the bonding portion is not arranged above the imaginary flat plane, the imaginary flat plane being parallel to the second bonding surface and passing through a middle point of a height of the optical member in a direction perpendicular to the second bonding surface.

4. The light-emitting device according to claim 1, wherein the second bonding surface of the optical member includes a plurality of regions including a first region and a second region, the first region and the second region being spaced apart from each other on a flat plane including the second bonding surface,
   the first inner side surface is located between the first region and the second region in a plan view as seen along a direction perpendicular to the second bonding surface, and
   the plurality of light-emitting elements and the optical member are positioned so that a part of the first light emitted from the first light-emitting element is configured to pass through the first region, and a part of the second light emitted from the second light-emitting element is configured to pass through the second region.

5. The light-emitting device according to claim 4, wherein the first bonding surface includes a plurality of light receiving regions including a first light receiving region and a second light receiving region, the first light receiving region and the second light receiving region being spaced apart from each other and aligned along a first direction, and
   in the plan view, the first region overlaps the first light receiving region and does not overlap the second light receiving region, and the second region overlaps the second light receiving region and does not overlap the first light receiving region.

6. The light-emitting device according to claim 5, wherein the optical member has
   a light incident surface where light emitted from each of the plurality of light-emitting elements is incident,
   a light emission surface where the light incident to the light incident surface is emitted, the light emission surface being opposite to the light incident surface, and
   a partial reflective surface configured to reflect a part of the light incident to the light incident surface and to transmit a rest of the light, and
   the rest of the light transmitted through the partial reflective surface is emitted from the light emission surface, and the part of the light reflected by the partial reflective surface is emitted from the second bonding surface.

7. The light-emitting device according to claim 6, wherein the first inner side surface extends in the optical member between a flat plane including the light incident surface and a flat plane including the light emission surface.

8. The light-emitting device according to claim 7, wherein the photodetector has an extension region extending in a second direction from a region where the optical member is bonded, and
   the photo detector includes a wiring pattern arranged in the extension region at a position spaced apart from the optical member by a predetermined distance in the plan view.

9. The light-emitting device according to claim 8, wherein the first direction and the second direction are same direction.

10. The light-emitting device according to claim 8, wherein
    the bonding portion is arranged on the first bonding surface of the photodetector, from a region, in which the optical member is bonded, to a part of the extension region, and the bonding portion is not arranged, in the extension region, in a region spaced apart from the optical member by the predetermined distance or longer in the plan view.

11. The light-emitting device according to claim 7, wherein
    the first inner side surface is arranged in a position not passed by a first imaginary straight line and not passed by a second imaginary straight line, the first imaginary straight line coinciding with an optical path at an outer edge of a main portion of the first light closest to the first inner side surface and incident to the light incident surface and reaching the partial reflective surface, and the second imaginary straight line coinciding with an optical path at an outer edge of a main portion of the second light closest to the first inner side surface and incident to the light incident surface and reaching the partial reflective surface.

12. The light-emitting device according to claim 4, wherein the plurality of light-emitting elements further includes a third light-emitting element configured to emit third light, the optical member further includes a second inner side surface continuous from the second bonding surface and a second lower surface intersecting an upper side of the second inner side surface, the bonding portion is further in contact with at least a part of the second inner side surface, the plurality of regions of the optical member further includes a third region, the second inner side surface is located between the second region and the third region in the plan view, the plurality of light-emitting elements and the optical member are positioned so that a part of the third light emitted from the third light-emitting element is configured to pass through the third region, the plurality of light receiving regions of the photodetector further includes a third light receiving region, and the first light-emitting element, the second light-emitting element, and the third light-emitting element emit light having colors different from each other and selected from red, green, and blue.

13. The light-emitting device according to claim 1, wherein the optical member defines a first through hole extending from the first inner side surface and penetrating from the second bonding surface to an upper surface of the optical member.

14. The light-emitting device according to claim 13, wherein the optical member further defines a second through hole penetrating from the second bonding surface to the upper surface of the optical member, the second bonding surface of the optical member includes a plurality of regions including a first region and a second region, the first through hole and the second through hole are arranged between the first region and the second region in a plan view as seen along a direction perpendicular to the second bonding surface, and the plurality of light-emitting elements and the optical member are positioned so that a part of the first light emitted from the first light-emitting element is configured to pass through the first region, and a part of the second light emitted from the second light-emitting element is configured to pass through the second region.

* * * * *